(12) United States Patent
Gunnam

(10) Patent No.: US 8,381,071 B1
(45) Date of Patent: Feb. 19, 2013

(54) SYSTEMS AND METHODS FOR DECODER SHARING BETWEEN DATA SETS

(75) Inventor: Kiran Gunnam, San Jose, CA (US)

(73) Assignee: LSI Corporation, Milpitas, CA (US)

(*) Notice: Subject to any disclaimer, the term of this patent is extended or adjusted under 35 U.S.C. 154(b) by 322 days.

(21) Appl. No.: 12/785,413

(22) Filed: May 21, 2010

(51) Int. Cl.
*G11C 29/00* (2006.01)

(52) U.S. Cl. .......................................... 714/763; 714/724

(58) Field of Classification Search ................ 714/763, 714/724, 726, 807, 761, 789, 814, 100, 49
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,958,074 A * | 9/1999 | Sugimoto ..................... 714/49 | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,047,112 A * | 4/2000 | Wise et al. ..................... 714/1 |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,223,312 B1 * | 4/2001 | Nozuyama ................. 714/724 |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |

(Continued)

OTHER PUBLICATIONS

U.S. Appl. No. 11/461,026, filed Jul. 31, 2006, Tan, Weijun.

(Continued)

*Primary Examiner* — Fritz Alphonse

(74) *Attorney, Agent, or Firm* — Hamilton DeSanctis & Cha

(57) ABSTRACT

Various embodiments of the present invention provide systems and methods for data processing. For example, a method for data processing is disclosed that includes providing a decoder processing circuit having a first memory, a second memory, and a decoder circuit; and providing a centralized queue communicably coupled to the decoder processing circuit. A first data set is loaded from the centralized queue to the first memory, and concurrent with the loading the first data set, a data decoding algorithm is applied to a second data set by the decoder circuit.

33 Claims, 10 Drawing Sheets

U.S. PATENT DOCUMENTS

| | | | |
|---|---|---|---|
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 7,430,256 B2 | 3/2005 | Zhidkov |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghavan et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghavan et al. |
| 7,502,189 B2 | 3/2009 | Sawaguchi et al. |
| 7,505,537 B1 | 3/2009 | Sutardja |
| 7,523,375 B2 | 4/2009 | Spencer |
| 7,587,657 B2 | 9/2009 | Haratsch |
| 7,590,168 B2 | 9/2009 | Raghavan et al. |
| 7,702,989 B2 | 4/2010 | Graef et al. |
| 7,712,008 B2 | 5/2010 | Song et al. |
| 7,752,523 B1 | 7/2010 | Chaichanavong et al. |
| 7,801,200 B2 | 9/2010 | Tan |
| 7,802,163 B2 | 9/2010 | Tan |
| 7,843,760 B2 * | 11/2010 | Bull et al. | 365/230.06 |
| 2003/0063405 A1 | 4/2003 | Jin et al. |
| 2003/0081693 A1 | 5/2003 | Raghavan et al. |
| 2003/0087634 A1 | 5/2003 | Raghavan et al. |
| 2003/0112896 A1 | 6/2003 | Raghavan et al. |
| 2003/0134607 A1 | 7/2003 | Raghavan et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam et al. |
| 2008/0301521 A1 | 12/2008 | Gunnam et al. |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghavan et al. |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |

OTHER PUBLICATIONS

U.S. Appl. No. 11/461,198, filed Jul. 31, 2006, Tan, Weijun.

U.S. Appl. No. 11/461,283, filed Jul. 31, 2006, Tan, Weijun.

U.S. Appl. No. 12/540,283, filed Aug. 12, 2009, Liu, et al.

U.S. Appl. No. 12/652,201, filed Jan. 5, 2010, Mathew, et al.

U.S. Appl. No. 12/763,050, filed Apr. 19, 2010, Ivkovic, et al.

U.S. Appl. No. 12/792,555, filed Jun. 2, 2001, Liu, et al.

U.S. Appl. No. 12/887,330, filed Sep. 21, 2010, Zhang, et al.

U.S. Appl. No. 12/887,369, filed Sep. 21, 2010, Liu et al.

U.S. Appl. No. 12/901,816, filed Oct. 11, 2010, Li et al.

U.S. Appl. No. 12/917,756, filed Nov. 2, 2010, Miladinovic et al.

U.S. Appl. No. 12/947,931, filed Nov. 17, 2010, Yang, Shaohua.

U.S. Appl. No. 12/947,947, filed Nov. 17, 2010, Ivkovic et al.

U.S. Appl. No. 12/972,942, filed Dec. 20, 2010, Liao et al.

Casado et al., Multiple-rate low- denstiy parity-check codes with constant blocklength, IEEE Transations on communications, Jan. 2009, vol. 57, pp. 75-83.

Collins and Hizlan, "Determinate State Convolutional Codes" IEEE Transactions on Communications, Dec. 1993.

Eleftheriou, E. et al., "Low Density Parity-Check Codes for Digital Subscriber Lines", Proc ICC 2002, pp. 1752-1757.

Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.

Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.

Gunnam, K et al. "Tech. Note on Iterative LDPC Solutions for Turbo Equal.", K. Gunnam, G. Choi and M. Yeary, TX A&M Tech. Note, Rpt. Dt: Jul. 2006 Avail. online dropzone.tamu.edu.

K. Gunnam et al., "Next Generation iterative LDPC solutions for magnetic recording storage, "invited paper. The Asilomar Conference on Signals, Systems, and Computers, Nov. 2008.

Han and Ryan, "Pinning Techniques for Low-Floor Detection/Decoding of LDPC-Coded Partial Response Channels", 5th International Symposium on Turbo Codes &Related Topics, 2008.

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Mohsenin et al., "Split Row: A Reduced Complexity, High Throughput LDPC Decoder Architecture", pp. 1-6, printed from www.ece.ucdavis.edu on Jul. 9, 2007.

Sari H et al., "Transmission Techniques for Digital Terrestrial TV Broadcasting" IEEE Communications Magazine, IEEE Service Center Ny, NY vol. 33, No. 2 Feb. 1995.

Unk, "Auto threshold and Auto Local Threshold" [online] [retr. May 28, 2010] Retr. from the Internet www.dentristy.bham.ac.uk/landinig/software/autothreshold/autothreshold.html.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Wang Y et al., "A Soft Decision Decoding Scheme for Wireless COFDM With App. to DVB-T" IEEE Transactions on Consumer elect., IEEE Service Center, NY,NY vo. 50, No. 1 Feb. 2004.

Weon-Cheol L. et al., "Vitierbi Decoding Method Using Channel State Information in COFDM System" IEEE Trans. on Consumer Elect., IEEE Service Center, NY, NY vol. 45 No. 3 Aug. 1999.

Yeo et al., "VLSI Architecture for Iterative Decoders in Magnetic Storage Channels", Mar. 2001, pp. 748-55, IEEE trans. Magnetics, vol. 37, No. 2.

Youn, "BER Perf. Due to Irreg. of Row-Weoght Distr. of the Parity-Check Matirx in Irregular LDPC Codes for 10-Gb/s Optical Signals" Journal of Lightwave Tech., vol. 23 Sep. 9, 2005.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. on Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF(q)"(dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

* cited by examiner

SYSTEMS AND METHODS FOR DECODER SHARING BETWEEN DATA SETS

BACKGROUND OF THE INVENTION

The present inventions are related to systems and methods for decoding information, and more particularly to systems and methods for performing iterative data decoding.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any losses in data caused by various factors. In some cases, an encoding/decoding process is used to enhance the ability to detect a data error and to correct such data errors. As an example, a simple data detection and decode may be performed, however, such a simple process often lacks the capability to converge on a corrected data stream. To increase the possibility of convergence, various existing processes utilize two or more detection and decode iterations. In many cases, the aforementioned systems are inefficient.

Hence, for at least the aforementioned reasons, there exists a need in the art for advanced systems and methods for data processing.

BRIEF SUMMARY OF THE INVENTION

The present inventions are related to systems and methods for decoding information, and more particularly to systems and methods for performing iterative data decoding.

Various embodiments of the present invention provide methods for data processing that include providing a decoder processing circuit having a first memory, a second memory, and a decoder circuit; and providing a centralized queue communicably coupled to the decoder processing circuit. A first data set is loaded from the centralized queue to the first memory, and concurrent with the loading the first data set, a data decoding algorithm is applied to a second data set by the decoder circuit.

In some instances of the aforementioned embodiments, the methods further include: determining that applying the decoding algorithm to the second data set resulted in convergence of the second data set; determining that the second data set converged in an allocated number of local decoder iterations; loading a third data set into the second memory from the centralized queue; and applying the data decoding algorithm to the first data set by the decoder circuit concurrent with the loading the third data set. In other instances of the aforementioned embodiments, the methods further include: determining that an allocated number of decoder iterations have been applied to the second data set; unloading the second data set from the second memory to the centralized queue; loading a third data set into the second memory from the centralized queue; and applying the data decoding algorithm to the first data set by the decoder circuit concurrent with the loading the third data set. In some cases, unloading the second data set and loading the third data set is performed using a write after read operation.

In yet other instances of the aforementioned embodiments, the methods further include: determining that applying the decoding algorithm to the second data set resulted in convergence of the second data set; determining that the second data set converged in less than an allocated number of local decoder iterations; re-allocating a residual number of local decoder iterations to a third data set; loading the third data set into the second memory from the centralized queue; and concurrent with the loading the third data set, pausing loading the first data set from the centralized queue to the first memory. In some such instances, loading the third data set into the second memory from the centralized queue is done using an increased speed memory transfer. Such an increased speed memory transfer may be facilitated by allocating transfer bandwidth between the first memory and the centralized queue to transfers between the second memory and the centralized queue used for loading the third data set. In one particular case, the methods further include: transferring a fourth data set between the centralized queue and a detection processing circuit; and concurrent with the loading the third data set, pausing transferring the fourth data set from the centralized queue to the detection processing circuit.

In other instances, the methods further include writing hard decision data corresponding to the second data set to a hard decision memory. In some such instances, the second data set is a codeword. In other such instances, the second data set is a first component codeword corresponding to a codeword, and the methods further include: determining whether a second component codeword corresponding to the codeword failed to converge; and writing the hard decision data corresponding to the second data set to the centralized queue. In some cases, the methods further include approximating the second data set based on the hard decision data corresponding to the second data set to assemble the codeword prior to a subsequent data detection process.

Other embodiments of the present invention provide data processing systems that include a decoder processing circuit, a queue circuit, and a queue scheduling circuit. The decoder processing circuit has a first memory, a second memory, and a decoder circuit. The queue circuit communicably coupled to the decoder processing circuit, and the queue scheduling circuit operable to schedule loading of a first data set from the queue circuit to the first memory. The decoder circuit is operable to apply a data decoding algorithm to a second data set concurrent with the loading the first data set.

In some instances of the aforementioned embodiments, the queue scheduling circuit is operable to: schedule a number of decoder iterations to be applied to the second data set, and to schedule unloading the second data set from the second memory to the centralized queue and loading a third data set into the second memory from the centralized queue. Concurrent with the loading the third data set, the decoder circuit is operable to apply the data decoding algorithm to the first data set by the decoder circuit. In other instances of the aforementioned embodiments, the queue scheduling circuit is operable to schedule a number of decoder iterations to be applied to the second data set, and the decoder circuit is operable to determine that applying the decoding algorithm to the second data set resulted in convergence of the second data set and to determine that the second data set converged in less than an allocated number of local decoder iterations. In addition, the queue scheduling circuit is operable to re-allocating a residual number of local decoder iterations to a third data set and to schedule loading the third data set into the second memory from the centralized queue, and concurrent with the loading the third data set, pausing loading the first data set from the centralized queue to the first memory.

Yet other embodiments of the present invention provide hard disk drive systems. Such hard disk drive systems include a data storage medium maintaining a first data set and a second data set, and a channel communicably coupled to the storage medium. The channel includes: a decoder processing circuit having a first memory, a second memory, and a decoder circuit; a queue circuit communicably coupled to the decoder processing circuit; and a queue scheduling circuit operable to schedule loading of the first data set from the queue circuit to the first memory. The decoder circuit is operable to apply a data decoding algorithm to the second data set concurrent with the loading the first data set.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for decoding information, and more particularly to systems and methods for performing iterative data decoding.

Various embodiments of the present invention provide for sharing decoder processing time between codewords fed from two or more data detection circuits where each of the codewords is capable of finishing after application of number of local iterations and/or global iterations which can vary between codewords. In the embodiments, decoder processing time expected to be applied to a codeword that converges early is re-assignable to processing another codeword such that the decoder processing time is used efficiently. In some cases, efficient use of decoder processing time relies on an enhanced memory access mechanism allowing for data that is needed on short notice to be accessed out of order from a central memory and provided to the decoder circuit.

Figure 1:
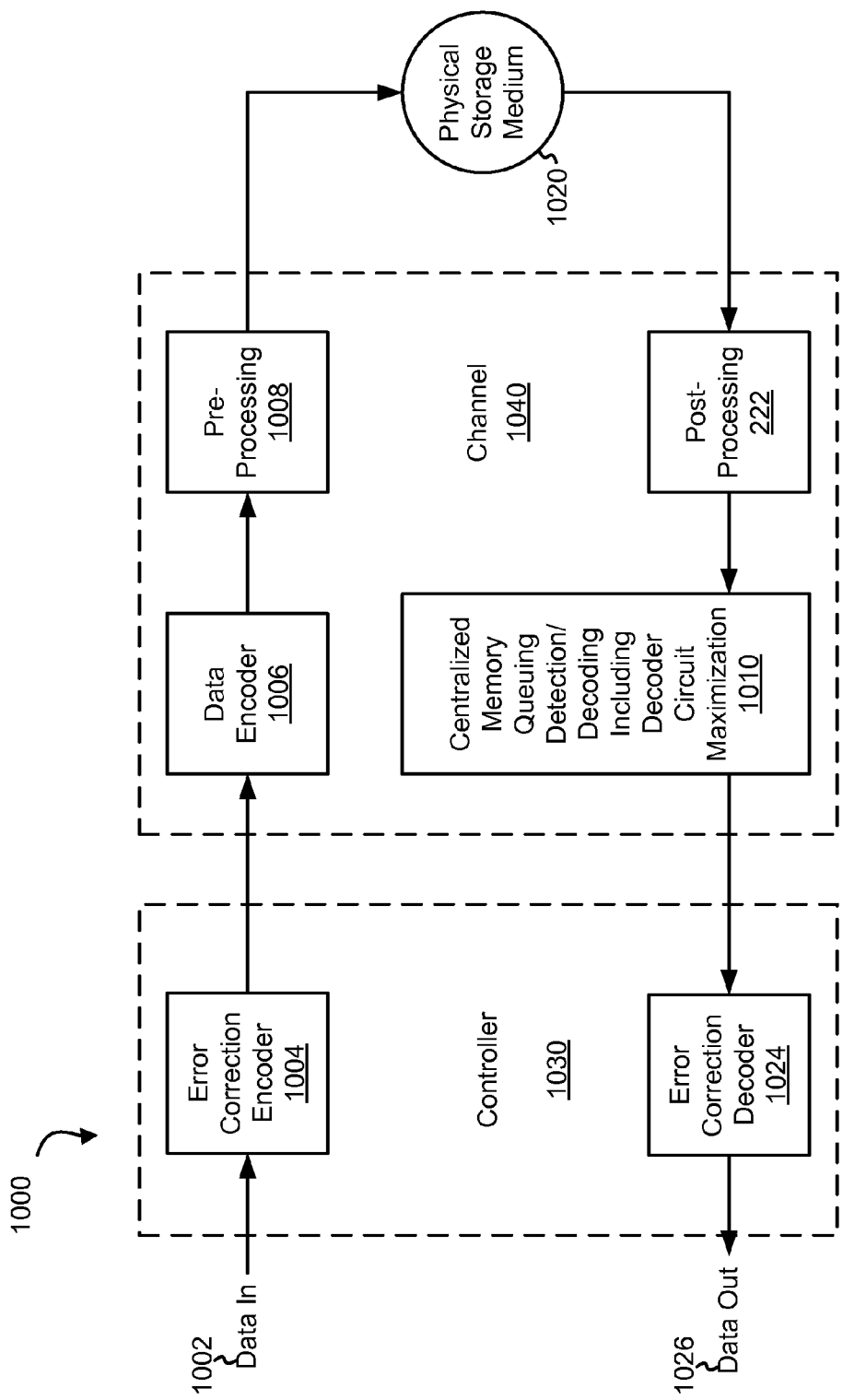
FIG. 1 depicts data storage system utilizing a centralized memory queuing detection/decoding system including decoder circuit maximization in accordance with some embodiments of the present invention.

Turning to FIG. 1, a storage system 1000 including a centralized memory queuing detection/decoding circuit 1010 is shown in accordance with some embodiments of the present invention. Storage system 1000 includes a controller 1030, a channel 1040, and a physical storage medium 1020. Physical storage medium 1020 may be, but is not limited to, a magnetic disk. Based on the disclosure provided herein, one of ordinary skill in the art will recognize a variety of physical storage media that may be used in relation to different embodiments of the present invention. Controller 1030 includes error correction encoding and decoding. In particular, controller 1030 includes an error correction encoder 1004. Error correction encoder 1004 may be any error correction encoder known in the art including, but not limited to, a Reed Solomon encoder or a CRC encoder, and error correction decoder 1024 may be, but is not limited to, a corresponding Reed Solomon decoder or CRC decoder. Both the aforementioned encoder and decoder may be any circuit or system known in the art that is capable of performing encoding and decoding processes. Channel 1040 includes a data encoder 1006 and a pre-processing circuit 1008. In some cases, data encoder 1006 is a Low Density Parity Check (LDPC) encoder. Based on the disclosure provided herein, one of ordinary skill in the art will recognize a variety of encoding processes and corresponding decoding processes that may be implemented in accordance with different embodiments of the present invention. Pre-processing circuit 1008 includes the various pre-processing circuitry that is well known in the art. Post-processing circuit 1022 includes the various post-processing circuitry that is well known in the art for receiving data from a physical storage medium and for preparing the received data for data detection and decoding.

In addition, channel 1040 includes centralized memory queuing detection/decoding circuit 1010 that is capable of efficient utilization of a decoder circuit where different codewords under process are capable of converging after a variable number of detection and decoding iterations. Such a centralized memory queuing detection/decoding circuit 1010 allows for performing a variable number of iterations on a given input, while minimizing the number of iterations that must be performed and efficiently distributing decoder processing time between codewords that are being processed. To perform this function, completion of input processing may be done out of order with the results reassembled at a later point.

In operation, a data input 1002 is received. Data input 1002 may be any data set destined for storage on physical storage medium 1020. Data input 1002 is encoded using error correction encoder 1004 as is known in the art. The output of error correction encoder 1004 is provided to data encoder 1006 that may, for example, perform an LDPC encoding of the data. The output of data encoder 1006 is provided to pre-processing circuit 1008 that may convert the output from a digital output to an analog output satisfactory for writing to physical storage medium 1020.

The data previously written to physical storage medium 1020 may be subsequently retrieved and processed by post-processing circuit 1022. In one case, post-processing circuit 1022 performs an amplification of an analog data signal retrieved from physical storage medium 1020, and converts the amplified analog signal to a digital signal that is output to centralized memory queuing detection/decoding circuit 1010. In turn, centralized memory queuing detection/decoding circuit 1010 performs a variable number of data detection and data decoding processes until either the output of the process converges (i.e., it adequately represents the original data encoded by data encoder 1006) or until insufficient resources remain to perform additional processing. Centralized memory queuing detection/decoding circuit 1010 provides its result as an output to error correction decoder 1024. Error correction decoder 1024 performs the designated error correction processing to determine whether any errors remain and if detected, attempts to correct the errors. Once the error correction processes are completed, error correction decoder 1024 provides a data output 1026. In general, data output 1026 corresponds to data input 1002 that was originally provided for writing to physical storage medium 1020.

Figure 2:
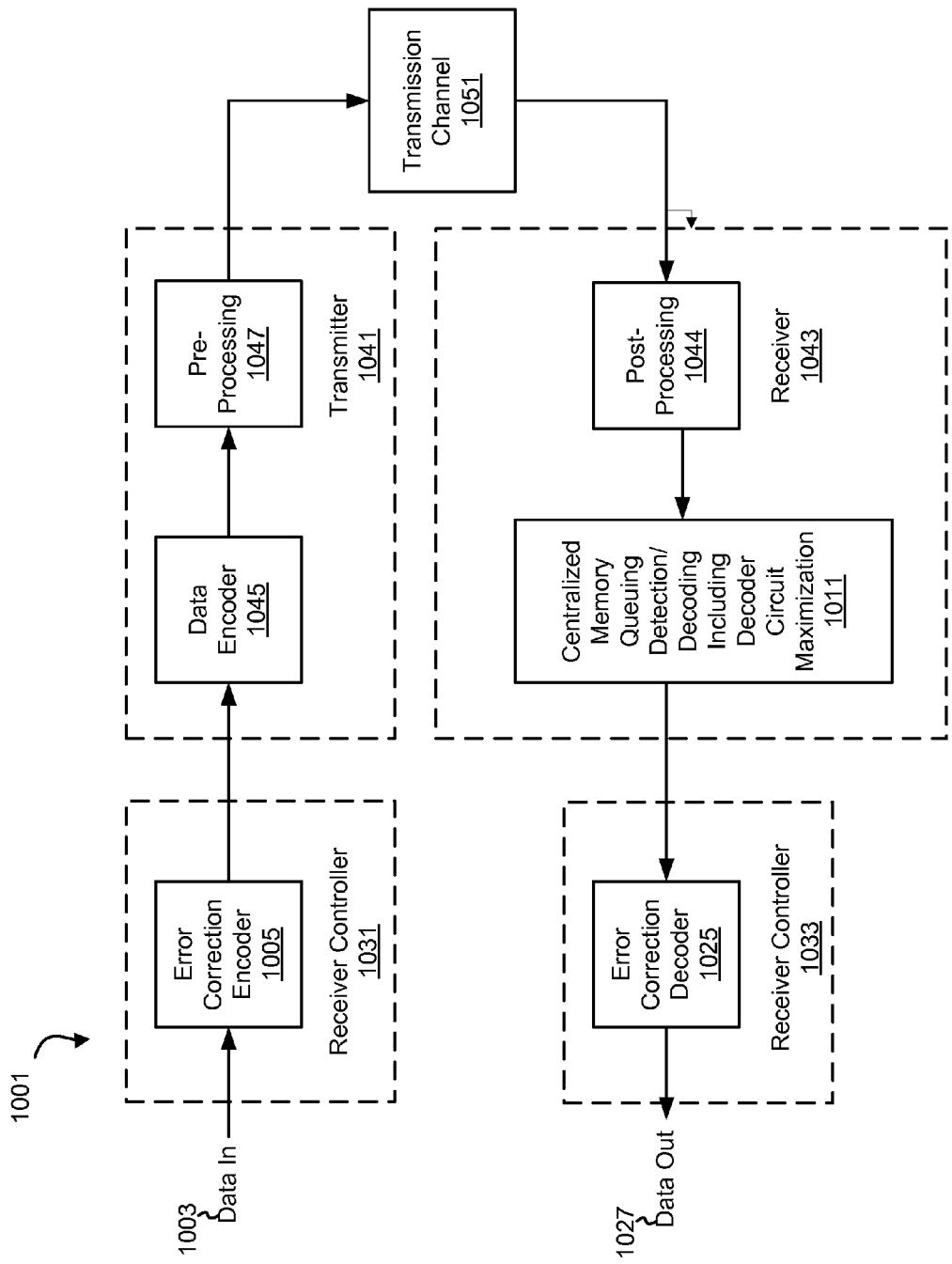
FIG. 2 depicts a data transfer system utilizing a centralized memory queuing detection/decoding system including decoder circuit maximization in accordance with other embodiments of the present invention.

Turning to FIG. 2, a transmission system 1001 including a centralized memory queuing detection/decoding circuit 1011 is depicted in accordance with some embodiments of the present invention. Transmission system 1001 includes a transmission controller 1031, a transmitter 1041, a transmission channel 1051, a receiver 1043, and a receiver controller 1033. Transmission channel may be, but is not limited to, an RF transmission channel. Based on the disclosure provided herein, one of ordinary skill in the art will recognize a variety of transmission channels that may be used in relation to different embodiments of the present invention. Transmission controller 1031 includes an error correction encoder that may be implemented, for example, as a Reed Solomon encoder or a CRC encoder. Similarly, receiver controller 1033 includes an error correction decoder 1025 corresponding to error correction encoder 1005. Thus, error correction decoder 1025 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 1041 includes a data encoder 1045 and a pre-processing circuit 1047. In some cases, data encoder 1045 is an LDPC encoder. Based on the disclosure provided herein, one of ordinary skill in the art will recognize a variety of encoding processes that may be implemented in accordance with different embodiments of the present invention. Pre-processing circuit 1047 includes the various pre-processing circuitry that is well known in the art. In one particular case, pre-processing circuit 1047 is operable to convert a digital data set from data encoder 1045 to a corresponding RF signal suitable for transmission via transmission channel 1051. The data set transferred via transmission channel 1051 is received using a post-processing circuit 1049 of receiver 1043. Post-processing circuit 1049 includes the various post-processing circuitry that is well known in the art for receiving data from a transmission channel and for preparing the received data for data detection and decoding.

In addition, receiver 1043 includes centralized memory queuing detection/decoding circuit 1011 that is capable of efficient utilization of a decoder circuit where different codewords under process are capable of converging after a variable number of detection and decoding iterations. Such a centralized memory queuing detection/decoding circuit 1011 allows for performing a variable number of iterations on a given input, while minimizing the number of iterations that must be performed and efficiently distributing decoder processing time between codewords that are being processed. To perform this function, completion of input processing may be done out of order with the results reassembled at a later point.

In operation, a data input 1003 is received. Data input 1003 may be any data set destined for transmission via transmission channel 1031. Data input 1003 is encoded using error correction encoder 1005 as is known in the art. The output of error correction encoder 1005 is provided to data encoder 1045 that may, for example, perform an LDPC encoding of the data. The output of data encoder 1045 is provided to pre-processing circuit 1047 that may convert the output from a digital output to an analog output satisfactory for transmission via transmission channel 1051.

The data transmitted via transmission channel 1051 is received and processed by post-processing circuit 1049 of receiver 1043. In one case, post-processing circuit 1049 performs an amplification of an analog data signal retrieved from transmission channel 1051, and converts the amplified analog signal to a digital signal that is output to centralized memory queuing detection/decoding circuit 1011. In turn, centralized memory queuing detection/decoding circuit 1011 performs a variable number of data detection and data decoding processes until either the output of the processes converges (i.e., it adequately represents the original data encoded by data encoder 1045) or until insufficient resources remain to perform additional processing. Centralized memory queuing detection/decoding circuit 1011 provides its result as an output to error correction decoder 1025. Error correction decoder 1025 performs the designated error correction processing to determine whether any errors remain and if detected, attempts to correct the errors. Once the error correction processes are completed, error correction decoder 1025 provides a data output 1027. In general, data output 1027 corresponds to data input 1003 that was originally provided for transmission via transmission channel 1051.

It should be noted that while FIGS. 1-2 depict a storage system and a transmission system to which a queuing detection/decoding circuit and/or process may be applied, that there are a variety of systems in which queuing detection/decoding circuits in accordance with different embodiments of the present invention may be applied. Based on the disclosure provided herein, one of ordinary skill in the art will recognize a variety of systems that may be benefited by use of a queuing detection/decoding circuit and/or process in accordance with different embodiments of the present invention.

Figure 3:
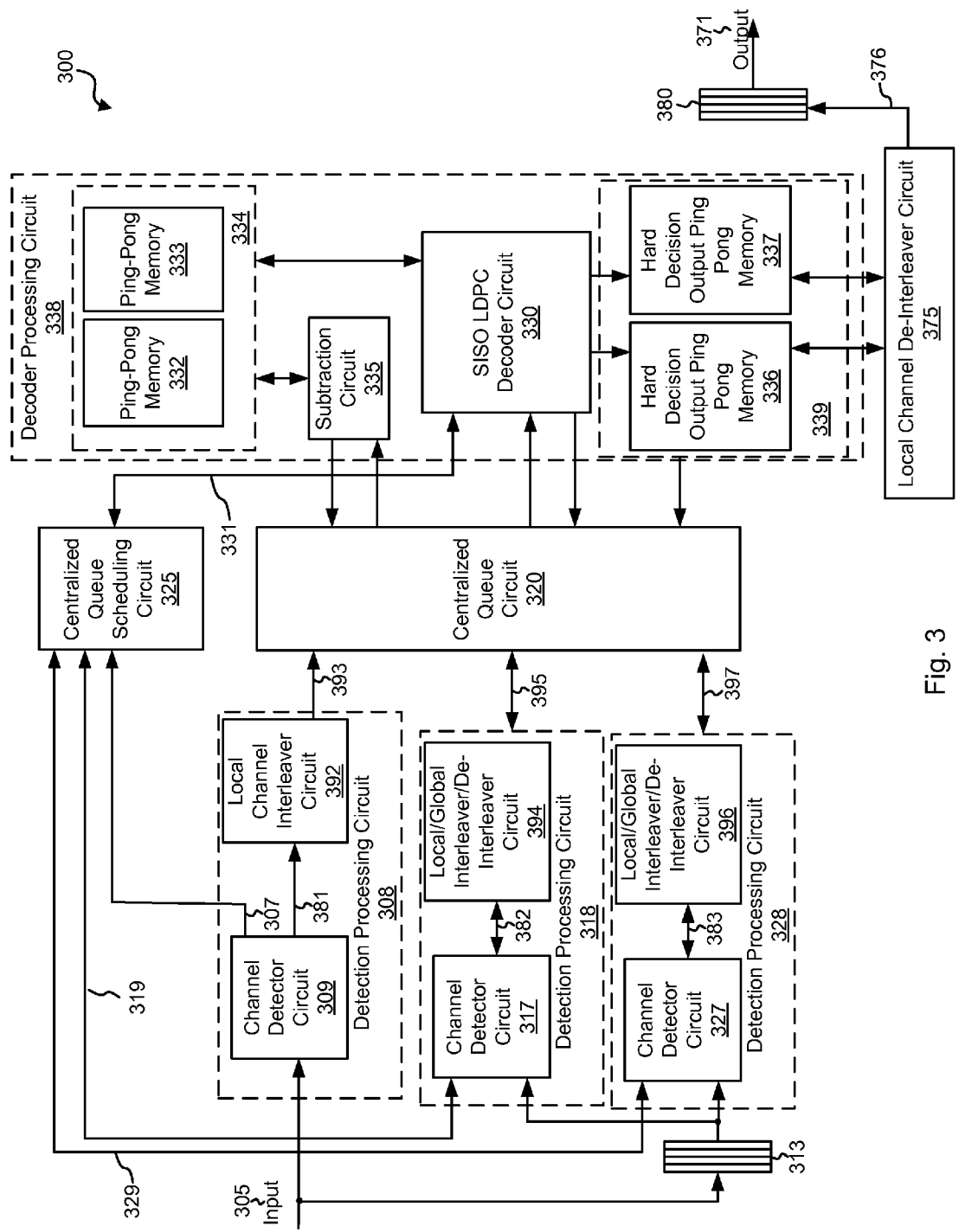
FIG. 3 shows a centralized memory queuing detection/decoding system in accordance with various embodiments of the present invention.

Turning to FIG. 3, a centralized memory queuing detection/decoding system 300 is shown in accordance with various embodiments of the present invention. Centralized memory queuing detection/decoding circuit 300 is similar to that disclosed in U.S. patent application Ser. No. 12/785,416 entitled "Systems and Methods for Variable Data Processing Using a Central Queue", and filed by Gunnam et al. on a date even herewith. The entirety of the aforementioned reference is incorporated herein by reference for all purposes. Centralized memory queuing detection/decoding circuit 300 includes a data input 305 that is fed to a detection processing circuit 308. Detection processing circuit 308 includes a channel detector circuit 309 and a local channel interleaver circuit 392. Channel detector circuit 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. Local channel interleaver circuit 392 receives a detected output 381 from channel detector circuit 309 and performs an interleaving process on the received data. The interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle or interleaving algorithms that may be used in relation to various embodiments of the present invention. An interleaved output 393 is provided to a centralized queue circuit 320. It should be noted that in some embodiments of the present invention detection processing circuit 308 includes only channel detector circuit 309. In such cases, detected output 381 is provided directly to a centralized queue circuit 320. A processing status signal 307 of channel detector circuit 309 is provided to a centralized queue scheduling circuit 325. In some cases, processing status signal 307 indicates a completion of processing of a data set provided as data input 305 (i.e., the availability of the completed data set in centralized queue circuit 320).

In addition, data input 305 is provided to a memory buffer 313 that is designed to hold a number of data sets received from data input 305. The size of memory buffer 313 may be selected to provide sufficient buffering such that a data set received via data input 305 remains available at least until a first iteration processing of that same data set is complete and the processed data is available in centralized queue circuit 320 as more fully described herein. Memory buffer 313 provides the data sets to a detection processing circuit 318. Detection processing circuit 318 includes a channel detector circuit 317 and a local/global channel interleaver/de-interleaver circuit 394. Channel detector circuit 317 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

Local/global channel interleaver/de-interleaver circuit 394 receives a detected output via a connection 382 from channel detector circuit 317 and performs an interleaving process on the received data. Similar to that described above in relation to local channel interleaver circuit 392, the interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle algorithms that may be used in relation to various embodiments of the present invention. An interleaved output is provided via a connection 395 to centralized queue circuit 320.

In addition, local/global channel interleaver/de-interleaver circuit 394 receives an interleaved data set via connection 395 from centralized queue circuit 320. Local/global channel interleaver/de-interleaver circuit 394 reverses the shuffling that was earlier applied by any of a local/global channel interleaver/de-interleaver circuit 396, local/global channel interleaver/de-interleaver circuit 394, or local channel interleaver circuit 392. Local/global channel interleaver/de-interleaver circuit 394 provides a de-interleaved output via connection 382 to channel detector circuit 317. Based on the disclosure provided herein, one of ordinary skill in the art will recognize a variety of de-interleaving approaches that may be used in relation to different embodiments of the present invention.

A processing status signal 319 is provided between centralized queue scheduling circuit 325 and channel detector circuit 317. In some cases, processing status signal 319 indicates a completion of processing of a data set when one signal of processing status signal 319 is asserted by channel detector circuit 317, and authorization to begin accessing a data set from centralized queue circuit 320 is indicated when centralized queue scheduling circuit 325 asserts another signal in processing status signal 319.

Data from memory buffer 313 is also provided to a detection processing circuit 328 that includes a channel detector circuit 327 and local/global channel interleaver/de-interleaver circuit 396. Channel detector circuit 327 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

Local/global channel interleaver/de-interleaver circuit 396 receives a detected output via a connection 383 from channel detector circuit 327 and performs an interleaving process on the received data. Similar to that described above in relation to local channel interleaver circuit 392, the interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle algorithms that may be used in relation to various embodiments of the present invention. An interleaved output is provided via a connection 397 to centralized queue circuit 320.

In addition, local/global channel interleaver/de-interleaver circuit 396 receives an interleaved data set via connection 397 from centralized queue circuit 320. Local/global channel interleaver/de-interleaver circuit 394 reverses the shuffling that was earlier applied by any of a local/global channel interleaver/de-interleaver circuit 396, local/global channel interleaver/de-interleaver circuit 394, or local channel interleaver circuit 392. Local/global channel interleaver/de-interleaver circuit 396 provides a de-interleaved output via connection 383 to channel detector circuit 327. Based on the disclosure provided herein, one of ordinary skill in the art will recognize a variety of de-interleaving approaches that may be used in relation to different embodiments of the present invention.

A processing status signal 329 is provided between centralized queue scheduling circuit 325 and channel detector circuit 327. In some cases, processing status signal 329 indicates a completion of processing of a data set when one signal of processing status signal 329 is asserted by channel detector circuit 327, and authorization to begin accessing a data set from centralized queue circuit 320 is indicated when centralized queue scheduling circuit 325 asserts another signal in processing status signal 329.

Centralized queue circuit 320 is a storage circuit capable of maintaining data sets provided by detection processing circuit 308, data sets provided by detection processing circuit 318, and data sets provided by a decoder processing circuit 338. In some cases, centralized queue circuit 320 is a dual port memory allowing accesses by two requestors at a time. In other cases, centralized queue circuit 320 is a single port memory allowing accesses by only one requestor at a time. In various cases, a write after read access is used to increase the bandwidth of a single port implementation.

Data sets previously processed by detection processing circuit 308, detection processing circuit 318, or detection processing circuit 328 are decoded by decoder processing circuit 338. Decoder processing circuit 338 includes a soft input/soft output (SISO) low density parity check (LDPC) decoder circuit 330, a decoder memory circuit 334 and a decoder memory circuit 339. Decoder memory circuit 334 includes a ping-pong memory 332 and a ping-pong memory 333. Decoder memory circuit 339 includes a ping-pong memory 336 and a ping-pong memory 337. In operation, decoder processing circuit 338 loads data provided from centralized queue circuit 320 into one of ping-pong memory 332 or ping-pong memory 333. At the same time, LDPC decoder circuit 330 applies a data decoding algorithm to the data set maintained in ping-pong memory 333. During the decoding process, LDPC decoder circuit 330 uses ping-pong memory 333 as a processing memory. Where the decoding process fails to converge, decoder processing circuit 338 writes the decoded data set from ping-pong memory 333 to centralized queue circuit 320 via a subtraction circuit 335. Subtraction circuit 335 pulls the L messages previously written to centralized queue circuit 320 by one of the data detection processing circuits 308, 318, 328 and subtracts the corresponding P messages generated by LDPC decoder circuit 330 to yield the extrinsic values (i.e., the E messages). The resulting E messages are written back to centralized queue circuit 320 as ping-pong memory 333 is unloaded. Concurrently, LDPC decoder circuit 330 applies a data decoding algorithm to the data set previously loaded into ping-pong memory 332. During this processing, LDPC decoder circuit 330 uses ping-pong memory 332 as a processing memory.

In one particular embodiment of the present invention, LDPC decoder circuit 330 is operable to perform a total of fifteen local iterations (i.e., a pass through LDPC decoder circuit 330) spread across three global iterations (i.e., a pass through one or detection processing circuits 308, 318, 328 and LDPC decoder circuit 330). In such a case, each of detection processing circuits 308, 318, 328 and decoder processing circuit 338 are operating on a distinct data sets at any given time allowing for processing in each to be performed without interaction with the other. In some cases, each of detection processing circuits 308, 318, 328 processes four samples per clock cycle.

Alternatively, where the processing of the data set maintained in ping-pong memory 333 converges, the converged data is written out to one of hard decision ping-pong memory 336 or hard decision ping-pong memory 337. Concurrently, any converged data set maintained in the other of hard decision ping-pong memory 336 or hard decision ping-pong memory 337 is unloaded to a local channel de-interleaver circuit 375. Local channel de-interleaver circuit 375 reverses the shuffling that was applied by any of a local/global channel interleaver/de-interleaver circuit 396, local/global channel interleaver/de-interleaver circuit 394, or local channel interleaver circuit 392. The resulting de-interleaved data set 376 is written to one buffer area of an output buffer 380.

Centralized memory queuing detection/decoding circuit 300 allows for performance of a variable number of detection and decoding iterations depending upon the introduced data. Further, in some cases, considerable power savings may be achieved through use of centralized memory queuing detection/decoding circuit 300. Yet further, in some cases, a faster LDPC decoder may be implemented allowing for an increased throughput where substantial first iteration data convergence exists as multiple iterations are not necessarily required. Yet further, by allowing results of LDPC decoder circuit 330 to be reported out of order via decoder memory circuit 339, upstream processing does not have to wait for the completion of downstream processing. Re-ordering of the out of order results may be done by centralized memory queuing detection/decoding circuit 300 or by a downstream recipient of an output 371.

A processing status signal 331 is provided between decoder processing circuit 338 and centralized queue scheduling circuit 325. In some cases, processing status signal 331 indicates a completion of processing of a data set when one signal of processing status signal 331 is asserted by decoder processing circuit 338, and authorization to begin accessing a data set from centralized queue circuit 320 is indicated when centralized queue scheduling circuit 325 asserts another signal in processing status signal 331.

Centralized queue scheduling circuit 325 is responsible for controlling access into and out of centralized queue circuit 320, and for directing the data to be processed by detection processing circuit 318, detection processing circuit 328, and decoder processing circuit 338 during any given time increment. As such, processing status signal 331 provides an indication of which data is to be accessed by decoder processing circuit 338 when access to centralized queue circuit 320 is granted, processing status signal 319 provides an indication of which data is to be accessed by detection processing circuit 318 when access to centralized queue circuit 320 is granted, and processing status signal 329 provides an indication of which data is to be accessed by detection processing circuit 328 when access to centralized queue circuit 320 is granted. When centralized queue scheduling circuit 325 indicates via processing status signal 319 that access is available into centralized queue circuit 320 by detection processing circuit 318, it also indicates the previously decoded data set that is to be retrieved from centralized queue circuit 320. Similarly, when centralized queue scheduling circuit 325 indicates via processing status signal 329 that access is available into centralized queue circuit 320 by detection processing circuit 328, it also indicates the previously decoded data set that is to be retrieved from centralized queue circuit 320. In addition, when centralized queue scheduling circuit 325 indicates via processing status signal 331 that access is available into centralized queue circuit by decoder processing circuit 338, it also indicates the previously detected data set that is to be retrieved from centralized queue circuit 320.

Centralized queue scheduling circuit 325 determines what data is to be processed next based upon various quality metrics generated by decoder processing circuit 338. Such quality metrics may include, but are not limited to, a number of remaining errors in a given data set. As an example, where a data set is very close to converging (i.e., it has only limited remaining errors) it may be selected to go before another data set under a theory that the data set will finish on the next pass. Alternatively, a data set that is nearing a timeout condition may be selected to be processed earlier than one having a large amount of time remaining. As yet another alternative, a data set may be selected based on nearing a maximum latency threshold dictated by the depth of output buffer 380. Based upon the disclosure provided herein, one of ordinary skill in the art will recognize a variety of metrics and corresponding scheduling criteria that may be used in relation to different embodiments of the present invention. In one particular embodiment of the present invention, all of the data sets traversing centralized memory queuing detection/decoding system 300 may be preempted such that processing proceeds in accordance with the quality metrics utilized by centralized queue scheduling circuit 325 to provide process ordering.

In operation, centralized queue scheduling circuit 325 is operable to reschedule access by LDPC decoder circuit 330 into and out of centralized queue circuit 320 whenever a codeword completes processing more quickly than a default expectation would suggest. For example, where four component codewords are being processed together, as a default each component codeword is assigned five local decoder iterations, and one of the four component codewords completes during a preceding global iteration and does not require the decoder processing time that it is expected to use, centralized queue scheduling circuit 325 is operable to grant access in and out of centralized queue circuit 320 to allow the decoder processing time that was not used in the early converging codeword to be assigned for use by another of the three component codewords.

As an example, if one of four component codewords converged on a previous global iteration and the default number of iterations assigned to each component codeword is eight, then the eight iterations that would have been used for the previously converged component codeword are allocated to one of the other component codewords that has not yet converged. As another example, if two of four component codewords converged on a previous global iteration and the default number of iterations assigned to each component codeword is eight, then the eight iterations that would have been used for one of the previously converged component codeword are allocated to one of the component codewords that has not yet converged, and the eight iterations that would have been used for the other of the previously converged component codeword are allocated to the other of the component codewords that has not yet converged. As yet another example, if three of four component codewords converged on a previous global iteration and the default number of iterations assigned to each component codeword is eight, then all twenty-four of the additional iterations are assigned to the component codeword that has not yet converged. In some embodiments, the preference as to which component codeword to assign the additional iterations is based upon which of the component codewords is farthest from convergence (i.e., has the highest number of remaining violated checks).

In some embodiments, the number of violated checks is computed after proves sing via detection processing circuit 308. This number of violated checks provides an indication of which codewords are expected to take a greater number of iterations to converge, and is used by centralized queue scheduling circuit 325. In some cases, centralized queue scheduling circuit 325 maintains an updated number of violated checks for the entire H matrix and for any other layers for each global and local iteration.

As used herein, the term "codeword" is used in its broadest sense to refer to any data set that may be processed by a data processing system, and the phrase "component codeword" is used in its broadest sense to mean any subset of a codeword. In some cases, component codewords may be processed independent of other component codewords, and in other cases all component codewords associated with a codeword are processed together. As one example of a data processing circuit including a data decoder circuit and a data detection circuit, all component codewords of a codeword may be required to process through the data detection circuit and component codewords may be processable independently through the data decoding circuit. Based upon the disclosure provided herein, one of ordinary skill in the art will recognize a variety of other scenarios that may be supported in relation to different embodiments of the present invention.

As discussed, LDPC decoder circuit 330 is shared for between codewords received from detection processing circuit 308, detection processing circuit 318 and detection processing circuit 328. To increase the throughput of centralized memory queuing detection/decoding circuit 300, delay between completion of processing by one of detection processing circuit 308, detection processing circuit 318, or detection processing circuit 328 and scheduling of decoder circuit 330 is minimized. In some instances, completion of one of detection processing circuit 308, detection processing circuit 318, or detection processing circuit 328 leads to an immediate scheduling of decoder circuit 330 to receive the respective output. In some cases, this includes loading the respective one of ping-pong memory 332 or ping-pong memory 333 with the data from the respective one of detection processing circuit 308, detection processing circuit 318, or detection processing circuit 328 as it finishes its processing. Thus, as the last interleaving is completed and written to centralized queue circuit 320, the last result from the detection process is unloaded from centralized queue circuit 320 and loaded into the respective ping-pong memory. In one particular embodiment of the present invention, loading the respective ping-pong memory begins when the data detection circuit from which the codeword is received has processed about two-thirds of the codeword. The decoding process performed on the loaded codeword by LDPC decoder circuit 330 begins immediately after the codeword is received from detection processing circuit 308 only if a codeword from detection processing circuit 318 or detection processing circuit 328 is not awaiting scheduling by centralized queue scheduling circuit 325.

Where a completed codeword is available from both detection processing circuit 318 and detection processing circuit 328, centralized queue scheduling circuit 325 schedules the codeword from detection processing circuit 318 first. Alternatively, where a completed codeword is available from detection processing circuit 328 and one is not available from detection processing circuit 318, centralized queue scheduling circuit 325 schedules the codeword from detection processing circuit 328. If a codeword from both detection processing circuit 318 and detection processing circuit 328 will be available at the same time, centralized queue scheduling circuit 325 schedules codeword from detection processing circuit 318 is scheduled first. If neither detection processing circuit 318 nor detection processing circuit 328 is immediately available, centralized queue scheduling circuit 325 schedules the codeword from whichever of detection processing circuit 318 or detection processing circuit 328 that will complete earliest.

Non-converging codewords are removed from processing after completion of the decoding process by LDPC decoder circuit 330. Removing a codeword from processing is done whenever a codeword converges and the hard decision data from LDPC decoder circuit 330 is written to decoder memory 339, or whenever too many non-converged codewords remain in the system. In one embodiment of the present invention, a non-converged codeword is removed from the system by writing the hard decision data from LDPC decoder circuit 330 to decoder memory 339 when there are more than four other non-converging codewords that remain for processing. In such a case, the oldest codeword (i.e., the codeword that was first introduced to detection processing circuit 308) is selected for removal by centralized queue scheduling circuit 325. The criteria for removing a non-converged codeword may be modified by changing the size of output buffer 380, memory buffer 313 and the memory of centralized queue circuit 320.

Some embodiments of the present invention provide for local sharing of LDPC decoder circuit 330. Such local sharing allows for allocating one or more expected or default iterations assigned to one component codeword to another component codeword. There are two types of local sharing that are supported. First, there is intra-codeword sharing where decoder processing time originally allocated to one component codeword of a give codeword is re-assigned to another component codeword of the given codeword. Second, there is inter-codeword sharing where decoder processing time originally allocated to one component codeword of a first codeword is re-assigned to another component codeword of a second codeword.

In some cases, where one of the component codewords converges before its allocated iterations, centralized queue scheduling circuit 325 begins an abort process on an ongoing transfer of a component codeword being transferred from centralized queue circuit 320 to decoder memory circuit 334. In addition, centralized queue scheduling circuit 325 begins an transfer from centralized queue circuit 320 to decoder memory circuit 334 of a component codeword that will utilize any decoder circuit iterations unused by the converged component codeword. In some cases, this initiated memory transfer is an increased speed memory transfer. In one particular case, the increased speed memory transfer operates at six times the transfer rate of a standard load from centralized queue circuit 320 to decoder memory circuit 334. Such an increased speed memory transfer can be used in relation to both intra-codeword local sharing and inter-codeword local sharing.

In some cases, such increased speed memory transfer is implemented by re-allocating memory bandwidth supported by centralized queue circuit 320 from support for transfers between centralized queue circuit 320 and one or more of detection processing circuit 308, detection processing circuit 318 and/or detection processing circuit 328 to support for transfers between centralized queue circuit 320 and decoder processing circuit 338.

For example, in one particular embodiment of the present invention, centralized queue circuit 320 is capable of supporting a total bandwidth of ninety-six (96) samples per clock that are allocated by dedicating: fifty-two (52) samples per clock for transfers between centralized queue circuit 320 and one or more of detection processing circuit 308, detection processing circuit 318, and detection processing circuit 328; twelve (12) samples per clock to transfers from centralized queue circuit 320 to decoder memory circuit 334; twenty-four (24) samples per clock for calculation of extrinsic values between subtraction circuit 335 and centralized queue buffer 320; and eight (8) samples per clock of idle bandwidth. Where the increased speed memory transfer is a six times speed up, it takes approximately one local iteration of decoder processing circuit 338. To allow this, a substantial amount of the preceding bandwidth may be re-allocated to transfers between centralized queue circuit 320 and decoder memory circuit 334. For example, where there are three component (CCWA that is previously converged and is slowly unloading from decoder circuit 330 to decoder memory circuit 339 and slowly unloading to centralized queue circuit 320 via subtraction circuit 335; CCWB that is a quickly converged component codeword; and CCWC that is loaded from centralized queue circuit 320 into decoder memory circuit 334), the following bandwidth allocation may be selected: twelve (12) samples per clock for transfers between centralized queue circuit 320 and detection processing circuit 308 with detection processing circuit 318 and detection processing circuit 328 temporarily paused by suspending an operating clock; and sixty-four (64) samples per clock for transfer of CCWC from centralized queue circuit 320 to decoder memory circuit 334. In one case where there is an ongoing extrinsic computation in relation to transferring CCA back to centralized queue circuit 320 via subtraction circuit 335, transfer of CCWA back to centralized queue buffer 320 is temporarily paused. In another case where there is an ongoing transfer of CCWA to decoder memory circuit 339, the transfer of hard decisions of CCWA from decoder memory circuit 339 to centralized queue circuit 320 is sped up from twelve (12) bits per clock to sixty-four (64) bits per clock and no abort operation is performed.

After the end of the increased speed memory transfer, the previously discussed bandwidth allocation are resumed. In particular, the following bandwidth allocation is resumed: fifty-two (52) samples per clock for transfers between centralized queue circuit 320 and one or more of detection processing circuit 308, detection processing circuit 318, and detection processing circuit 328; twelve (12) samples per clock to transfers from centralized queue circuit 320 to decoder memory circuit 334; twenty-four (24) samples per clock for calculation of extrinsic values between subtraction circuit 335 and centralized queue buffer 320; and eight (8) samples per clock of idle bandwidth.

Where only part of the component codewords converged in previous iterations, the component codewords (e.g., CCWB) are transferred back to centralized queue circuit 320 for additional processing at the default slow rate of twelve (12) samples per clock cycle similar to what is done for normally converged codeword transfers to both centralized queue circuit 320 and decoder memory circuit 339.

In addition, where the data detection processes require all of the component codewords of a given codeword to be together for the data detection process (i.e., due to the interleaving that is applied by centralized memory queuing detection/decoding system 300), the hard decisions associated with the component codeword that converged (i.e., CCWC) are transferred back to centralized queue circuit 320. Of note, such a transfer from decoder memory circuit 339 to centralized queue circuit 320 is only done where a component codeword belongs to a codeword having at least one unconverged component codeword.

Where hard decision data is provided from decoder memory circuit 339 directly to centralized queue circuit 320 in place of extrinsic data via subtraction circuit 335, subsequent global de-interleaving performed by local/global interleaver/de-interleaver circuit 394 and local/global interleaver/de-interleaver circuit 396 may be performed using a read only memory that is dedicated to the hard decisions that are received from decoder memory circuit 339. The read only memory is dedicated exclusively to hard decision data that may not be compatible with de-interleaving that is provided to extrinsic values provided via subtraction circuit 335.

Figure 4:
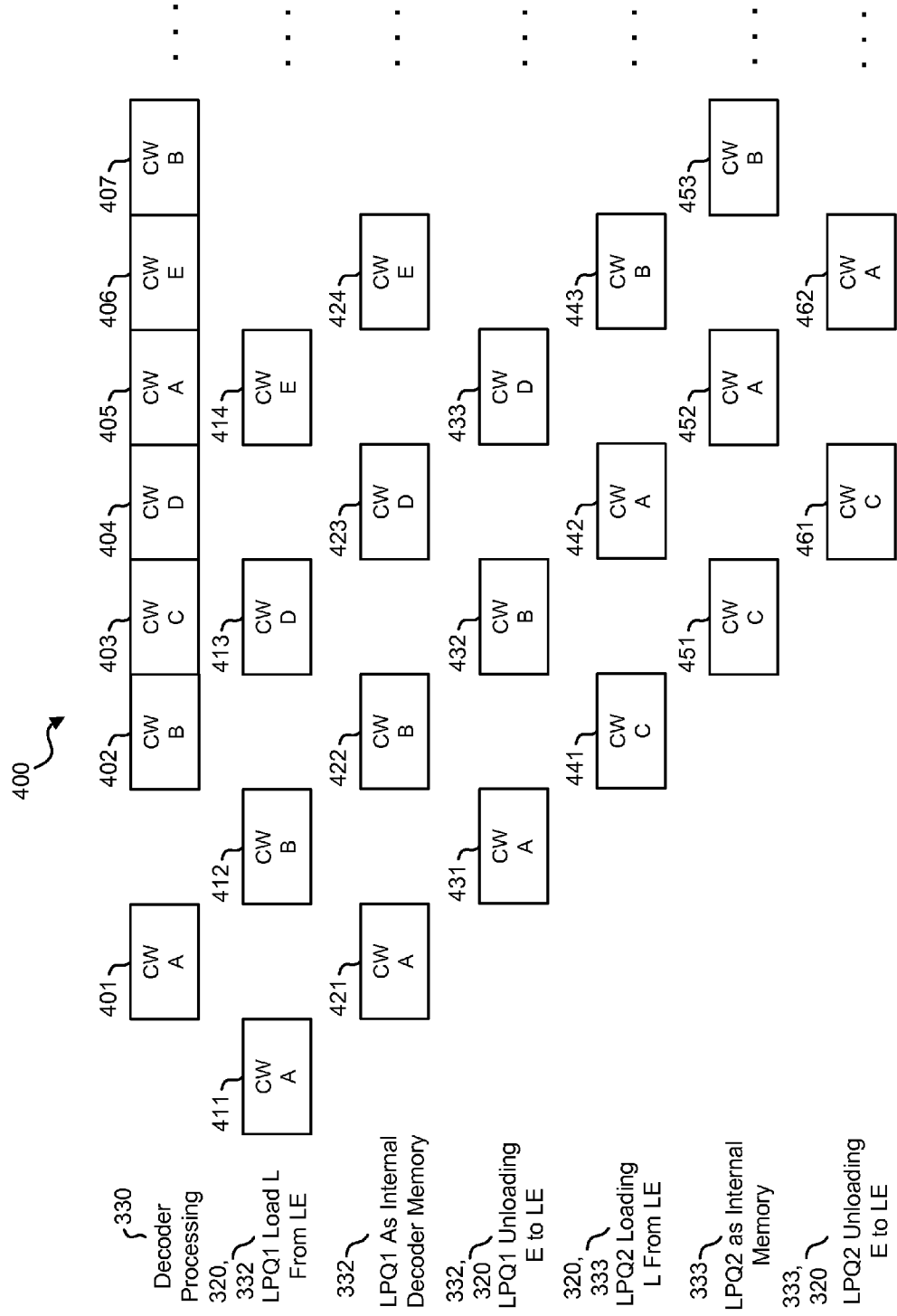
FIG. 4 is a timing diagram showing scheduling of the decoder during a process where each codeword utilizes the same number of local decoder iterations.

Turning to FIG. 4, a timing diagram 400 shows scheduling of data transfers in and out of decoder processing circuit 338 where each codeword utilizes the same number of local decoder iterations. Following timing diagram 400, a codeword A is loaded from centralized queue circuit 320 to ping-pong memory 332 (represented as block 411). LDPC decoder circuit 330 performs a set number of local decoder iterations on codeword A (represented as block 401) using ping-pong memory 332 as an internal decoder memory (represented as block 421). Once the default number of local decoder iterations are completed, decoder processing circuit 338 transfers codeword A back to centralized queue circuit 320 via subtraction circuit 335 that calculates extrinsic values (represented as block 431).

Concurrent with writing codeword A back to centralized queue circuit 320, a codeword B is loaded from centralized queue circuit 320 to ping-pong memory 332 (represented as block 412). Such a simultaneous transfer in and out of centralized queue circuit 320 is accomplished using a write after read access where a location of a portion of codeword A is unloaded immediately followed by locating a portion of codeword B to the same location. This process continues until all of codeword A is relocated to centralized queue circuit 320 and all of codeword B is relocated to ping-pong memory 332. Subsequently, LDPC decoder circuit 330 performs a set number of local decoder iterations on codeword B (represented as block 402) using ping-pong memory 332 as an internal decoder memory (represented as block 422). Concurrently, a codeword C is loaded from centralized queue circuit 320 to ping-pong memory 333 (represented as block 441).

Once the default number of local decoder iterations are completed on codeword B, decoder processing circuit 338 transfers codeword B back to centralized queue circuit 320 via subtraction circuit 335 that calculates extrinsic values (represented as block 432). Concurrently, a codeword D is loaded from centralized queue circuit 320 to ping-pong memory 332 (represented as block 413). Such a simultaneous transfer in and out of centralized queue circuit 320 is accomplished using a write after read access similar to that described above. The write after read process continues until all of codeword B is relocated to centralized queue circuit 320 and all of codeword D is relocated to ping-pong memory 332. Also concurrent with the transfer of codeword B to centralized queue circuit 320, LDPC decoder circuit 330 performs a set number of local decoder iterations on codeword C (represented as block 403) using ping-pong memory 333 as an internal decoder memory (represented as block 451).

Subsequently, LDPC decoder circuit 330 performs a set number of local decoder iterations on codeword D (represented as block 404) using ping-pong memory 332 as an internal decoder memory (represented as block 423). While the aforementioned decoding process is ongoing, codeword A is loaded from centralized queue circuit 320 to ping-pong memory 333 (represented as block 442), and codeword C is transferred from ping-pong memory 333 using a write after read process (block 461). The write after read process continues until all of codeword C is relocated to centralized queue circuit 320 and all of codeword A is relocated to ping-pong memory 333.

Subsequently, LDPC decoder circuit 330 performs a set number of local decoder iterations on codeword A (represented as block 405) using ping-pong memory 333 as an internal decoder memory (represented as block 452). While the aforementioned decoding process is ongoing, codeword E is loaded from centralized queue circuit 320 to ping-pong memory 332 (represented as block 414), and codeword D is transferred from ping-pong memory 332 using a write after read process (block 433). The write after read process continues until all of codeword D is relocated to centralized queue circuit 320 and all of codeword E is relocated to ping-pong memory 332.

Subsequently, LDPC decoder circuit 330 performs a set number of local decoder iterations on codeword E (represented as block 406) using ping-pong memory 332 as an internal decoder memory (represented as block 424). While the aforementioned decoding process is ongoing, codeword B is loaded from centralized queue circuit 320 to ping-pong memory 333 (represented as block 443), and codeword A is transferred from ping-pong memory 333 using a write after read process (represented as block 462). The write after read process continues until all of codeword A is relocated to centralized queue circuit 320 and all of codeword B is relocated to ping-pong memory 333.

Subsequently, LDPC decoder circuit 330 performs a set number of local decoder iterations on codeword B (represented as block 407) using ping-pong memory 333 as an internal decoder memory (represented as block 453). The process of decoding continues with new codewords being introduced as older codewords either converge or time out.

Figure 5:
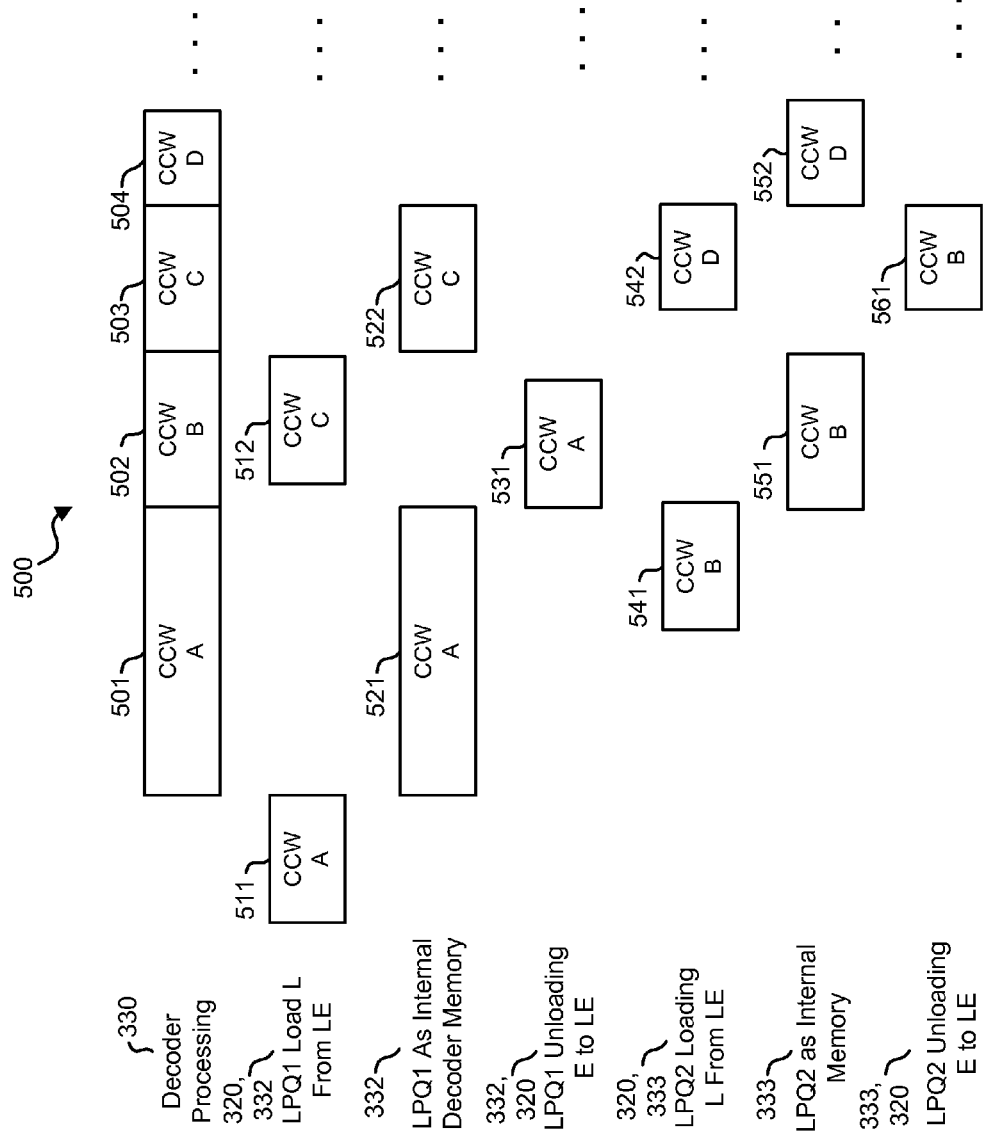
FIG. 5 is a timing diagram showing scheduling of the decoder during a process where each of four codewords utilizes a varied number of local decoder iterations.

Turning to FIG. 5, a timing diagram 500 shows scheduling of decoder processing circuit 338 where each of four codewords utilizes a varied number of local decoder iterations. Following timing diagram 500, a component codeword A (CCWA) is loaded from centralized queue circuit 320 to ping-pong memory 332 (represented as block 511). LDPC decoder circuit 330 performs a number of local decoder iterations on codeword A (represented as block 501) using ping-pong memory 332 as an internal decoder memory (represented as block 521). Of note, the number of local decoder iterations allowed is limited by those scheduled by centralized queue scheduling circuit 325 or convergence of component codeword A. Concurrently, a component codeword B is loaded from centralized queue circuit 320 to ping-pong memory 333 (represented as block 541).

Subsequently, LDPC decoder circuit 330 performs a number of local decoder iterations on codeword B (represented as block 502) using ping-pong memory 333 as an internal decoder memory (represented as block 551). Of note, the number of local decoder iterations allowed is limited by those scheduled by centralized queue scheduling circuit 325 or convergence of component codeword B. While the aforementioned decoding process is ongoing, component codeword C is loaded from centralized queue circuit 320 to ping-pong memory 332 (represented as block 512), and component codeword A is transferred from ping-pong memory 332 using a write after read process (represented as block 531). The write after read process continues until all of codeword A is relocated to centralized queue circuit 320 and all of codeword C is relocated to ping-pong memory 332.

Subsequently, LDPC decoder circuit 330 performs a number of local decoder iterations on codeword C (represented as block 503) using ping-pong memory 332 as an internal decoder memory (represented as block 522). Of note, the number of local decoder iterations allowed is limited by those scheduled by centralized queue scheduling circuit 325 or convergence of component codeword C. While the aforementioned decoding process is ongoing, component codeword D is loaded from centralized queue circuit 320 to ping-pong memory 333 (represented as block 542), and component codeword B is transferred from ping-pong memory 333 using a write after read process (represented as block 561). The write after read process continues until all of codeword B is relocated to centralized queue circuit 320 and all of codeword D is relocated to ping-pong memory 333.

Subsequently, LDPC decoder circuit 330 performs a number of local decoder iterations on codeword D (represented as block 504) using ping-pong memory 333 as an internal decoder memory (represented as block 552). Of note, the number of local decoder iterations allowed is limited by those scheduled by centralized queue scheduling circuit 325 or convergence of component codeword D. The process of decoding continues with new component codewords being introduced as older component codewords either converge or time out.

Of note, as indicated by the relative sizes of block 501, block 502, block 503, block 504, the number of local iterations represented by the blocks is different. The number of local decoder iterations applied to component codeword A (represented as block 501) is greater than the number of local decoder iterations applied to any of component codeword B (represented as block 502), component codeword C (represented as block 503) and component codeword D (represented as block 504). The number of local decoder iterations applied to component codeword B (represented as block 502) is greater than the number of local decoder iterations applied to component codeword D (represented as block 504), and the same as the number applied to component codeword C (represented as block 503).

Figure 6:
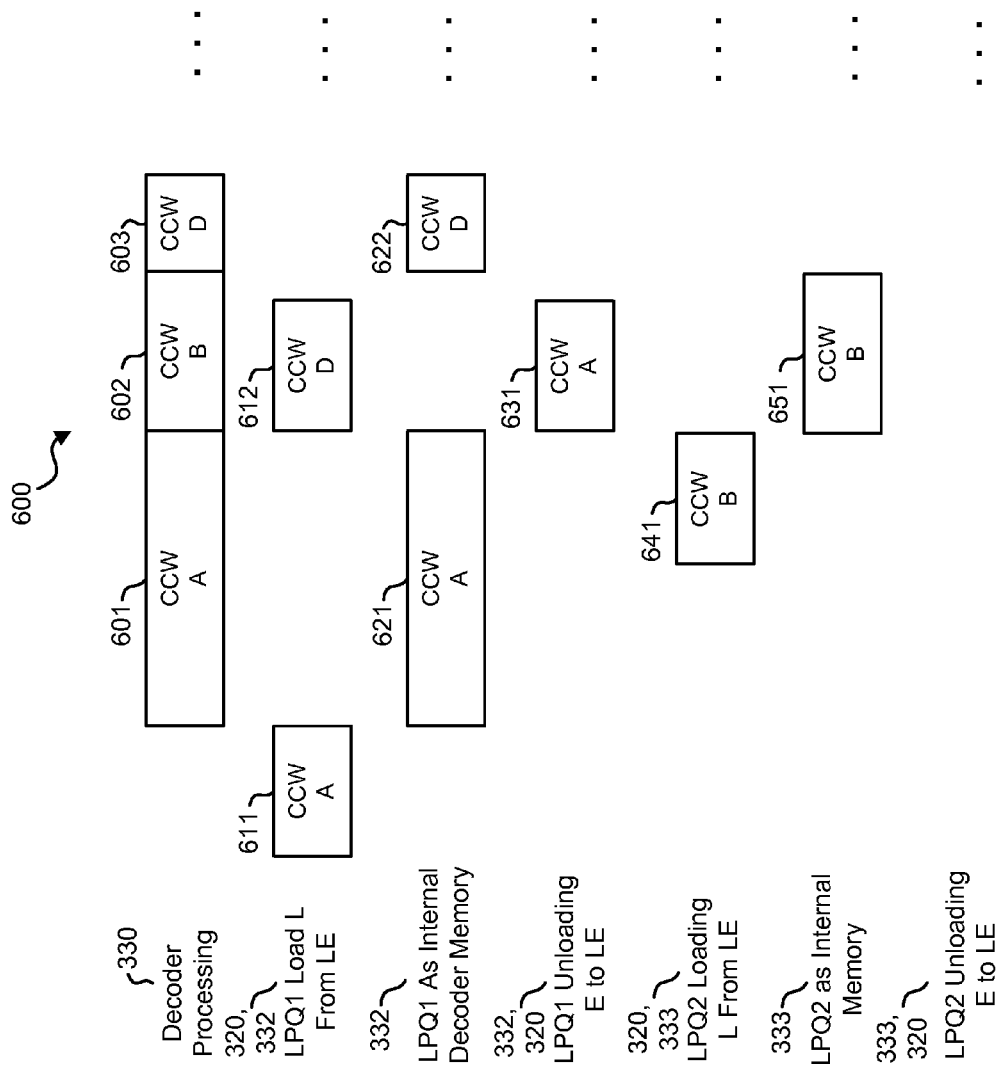
FIG. 6 is a timing diagram showing scheduling of the decoder during a process where one of four codewords converged during previous processing, and the other three codewords utilize a different number of local decoder iterations.

Turning to FIG. 6, a timing diagram 600 shows scheduling of decoder processing circuit 338 during a process where one of four component codewords converged during previous processing, and the other three component codewords utilize a different number of local decoder iterations. Following timing diagram 600, a component codeword A (CCWA) is loaded from centralized queue circuit 320 to ping-pong memory 332 (represented as block 611). LDPC decoder circuit 330 performs a number of local decoder iterations on codeword A (represented as block 601) using ping-pong memory 332 as an internal decoder memory (represented as block 621). Of note, the number of local decoder iterations allowed is limited by those scheduled by centralized queue scheduling circuit 325 or convergence of component codeword A. Concurrently, a component codeword B is loaded from centralized queue circuit 320 to ping-pong memory 333 (represented as block 641).

Subsequently, LDPC decoder circuit 330 performs a number of local decoder iterations on codeword B (represented as block 602) using ping-pong memory 333 as an internal decoder memory (represented as block 651). Of note, the number of local decoder iterations allowed is limited by those scheduled by centralized queue scheduling circuit 325 or convergence of component codeword B. While the aforementioned decoding process is ongoing, component codeword D is loaded from centralized queue circuit 320 to ping-pong memory 332 (represented as block 612), and component codeword A is transferred from ping-pong memory 332 using a write after read process (represented as block 631). The write after read process continues until all of codeword A is relocated to centralized queue circuit 320 and all of codeword D is relocated to ping-pong memory 332.

Subsequently, LDPC decoder circuit 330 performs a number of local decoder iterations on codeword D (represented as block 603) using ping-pong memory 332 as an internal decoder memory (represented as block 622). Of note, the number of local decoder iterations allowed is limited by those scheduled by centralized queue scheduling circuit 325 or convergence of component codeword D. The process of decoding continues with new component codewords being introduced as older component codewords either converge or time out.

Of note, as indicated by the relative sizes of block 601, block 602, and block 603, the number of local iterations represented by the blocks is different. The number of local decoder iterations applied to component codeword A (represented as block 601) is greater than the number of local decoder iterations applied to any of component codeword B (represented as block 602), and component codeword D (represented as block 603). The number of local decoder iterations applied to component codeword B (represented as block 602) is greater than the number of local decoder iterations applied to component codeword D (represented as block 603).

Figure 7:
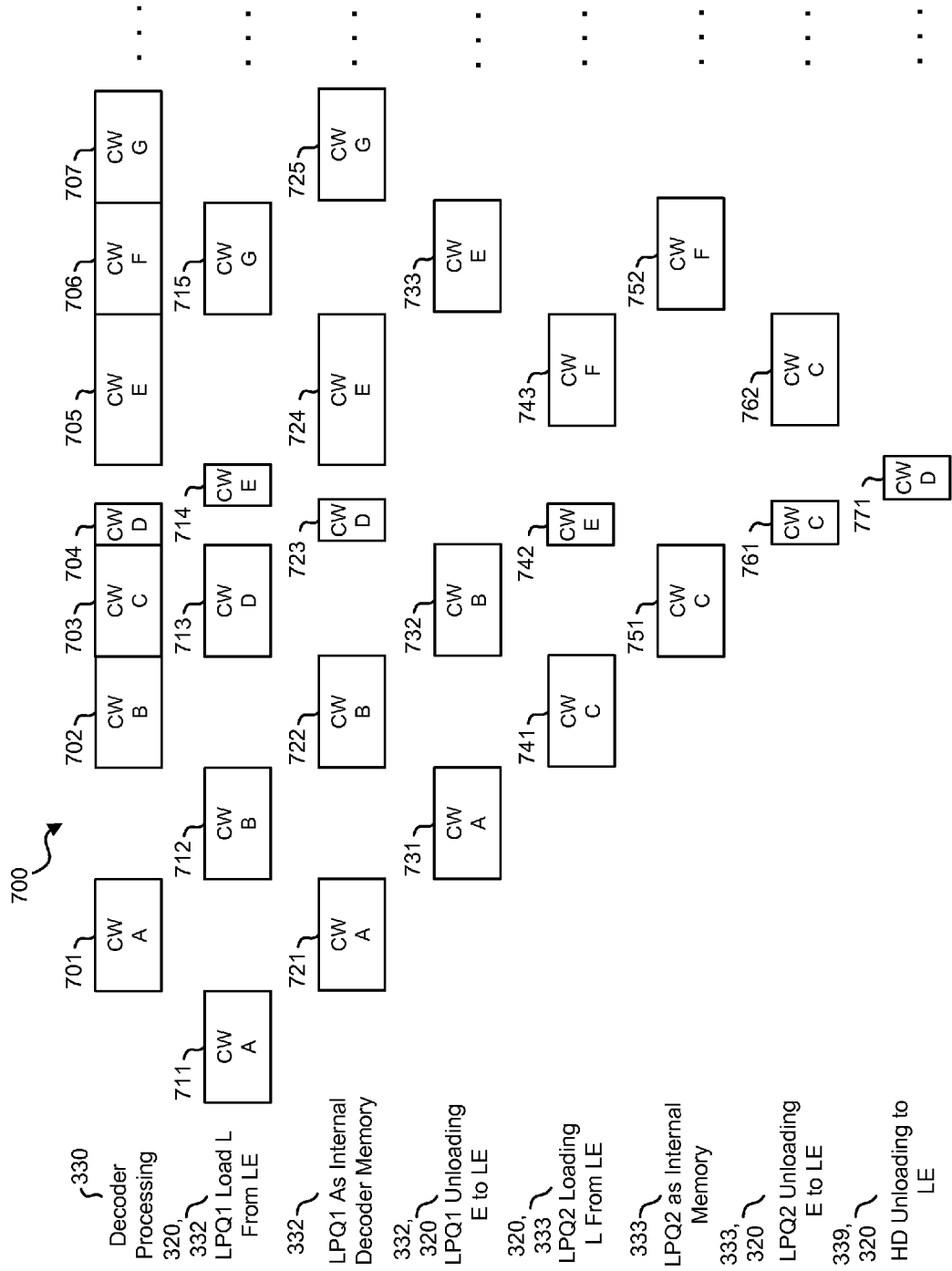
FIG. 7 is a timing diagram showing scheduling of the decoder during processing where one or more codewords converge early causing a speed up process for loading a later processed codeword.

Turning to FIG. 7, a timing diagram 700 shows scheduling of decoder processing circuit 338 during processing where one or more codewords converge early causing a speed up process for loading a later processed codeword. Following timing diagram 700, a codeword A is loaded from centralized queue circuit 320 to ping-pong memory 332 (represented as block 711). LDPC decoder circuit 330 performs a number of local decoder iterations on codeword A (represented as block 701) using ping-pong memory 332 as an internal decoder memory (represented as block 721). Once the number of local decoder iterations are completed, decoder processing circuit 338 transfers codeword A back to centralized queue circuit 320 via subtraction circuit 335 that calculates extrinsic values (represented as block 731).

Concurrent with writing codeword A back to centralized queue circuit 320, a codeword B is loaded from centralized queue circuit 320 to ping-pong memory 332 (represented as block 712). Such a simultaneous transfer in and out of centralized queue circuit 320 is accomplished using a write after read access where a location of a portion of codeword A is unloaded immediately followed by locating a portion of codeword B to the same location. This process continues until all of codeword A is relocated to centralized queue circuit 320 and all of codeword B is relocated to ping-pong memory 332. Write after read permits the sharing of same memory space allocated for a codeword by another codeword. In essence, memory allocated for the incoming codeword at the memory row level as the out going codeword is vacating the space occupied a memory row. Subsequently, LDPC decoder circuit 330 performs a number of local decoder iterations on codeword B (represented as block 702) using ping-pong memory 332 as an internal decoder memory (represented as block 722). Concurrently, a codeword C is loaded from centralized queue circuit 320 to ping-pong memory 333 (represented as block 741).

Once the number of local decoder iterations are completed on codeword B, decoder processing circuit 338 transfers codeword B back to centralized queue circuit 320 via subtraction circuit 335 that calculates extrinsic values (represented as block 732). Concurrently, a codeword D is loaded from centralized queue circuit 320 to ping-pong memory 332 (represented as block 713). Such a simultaneous transfer in and out of centralized queue circuit 320 is accomplished using a write after read access similar to that described above. The write after read process continues until all of codeword B is relocated to centralized queue circuit 320 and all of codeword D is relocated to ping-pong memory 332. Also concurrent with the transfer of codeword B to centralized queue circuit 320, LDPC decoder circuit 330 performs a number of local decoder iterations on codeword C (represented as block 703) using ping-pong memory 333 as an internal decoder memory (represented as block 751).

Subsequently, LDPC decoder circuit 330 performs a number of local decoder iterations on codeword D that result in convergence of codeword D (represented as block 704) using ping-pong memory 332 as an internal decoder memory (represented as block 723). To efficiently use decoder processing circuit 338, another codeword for decoding needs to be quickly loaded into decoder memory 334. To facilitate this, an ongoing low rate transfer of a codeword E from centralized queue circuit 320 to ping-pong memory 333 is aborted (represented as block 742), and a high speed transfer of codeword E from centralized queue circuit 320 to ping-pong memory 332 is performed (represented as block 714). To allow for such a high speed transfer, the ongoing transfer of codeword C from ping-pong memory 333 to centralized queue circuit 320 is paused (represented as blocks 761, 762). Such an increased speed memory transfer is caused by centralized queue scheduling circuit 325 that allocates bandwidth otherwise assigned to transfers between centralized queue circuit 320 and one or more of detection processing circuit 308, detection processing circuit 318, and detection processing circuit 328 to transfers between centralized queue circuit 320 and ping-pong memory 332. At the same time where codeword D is a component of another codeword, hard decision data corresponding to codeword D is transferred from decoder memory circuit 339 to centralized queue circuit 320 for use in later detection processes where all component codewords associated with a given codeword have not yet completed processing similar to that described below in relation to FIG. 10 (represented as block 771).

Once the increased speed memory transfer of codeword E from centralized queue circuit 320 is completed (represented as block 714), LDPC decoder circuit 330 performs a number of local decoder iterations on codeword E (represented as block 705) using ping-pong memory 332 as an internal decoder memory (represented as block 724). Local decoder iterations that were not utilized in processing codeword D due to the early convergence of codeword D (represented as block 704) are used in decoding codeword E (represented as block 705). This addition of unused local decoder iterations is represented by the longer block 705 compared with, for example, the block 703.

While the aforementioned decoding process is ongoing, loading a codeword F from centralized queue circuit 320 to ping-pong memory 333 is performed (represented as block 743), and the previously paused transfer of codeword C from ping-pong memory 333 using a write after read process (block 762) is completed. The write after read process continues until all of codeword C is relocated to centralized queue circuit 320 and all of codeword E is relocated to ping-pong memory 333.

Subsequently, LDPC decoder circuit 330 performs a number of local decoder iterations on codeword F (represented as block 706) using ping-pong memory 333 as an internal decoder memory (represented as block 752). While the aforementioned decoding process is ongoing, codeword G is loaded from centralized queue circuit 320 to ping-pong memory 332 (represented as block 715), and codeword E is transferred from ping-pong memory 332 using a write after read process (block 733). The write after read process continues until all of codeword B is relocated to centralized queue circuit 320 and all of codeword F is relocated to ping-pong memory 332. Subsequently, LDPC decoder circuit 330 performs a set number of local decoder iterations on codeword G (represented as block 707) using ping-pong memory 332 as an internal decoder memory (represented as block 725). The process of decoding continues with new codewords being introduced as older codewords either converge or time out.

Figure 8:
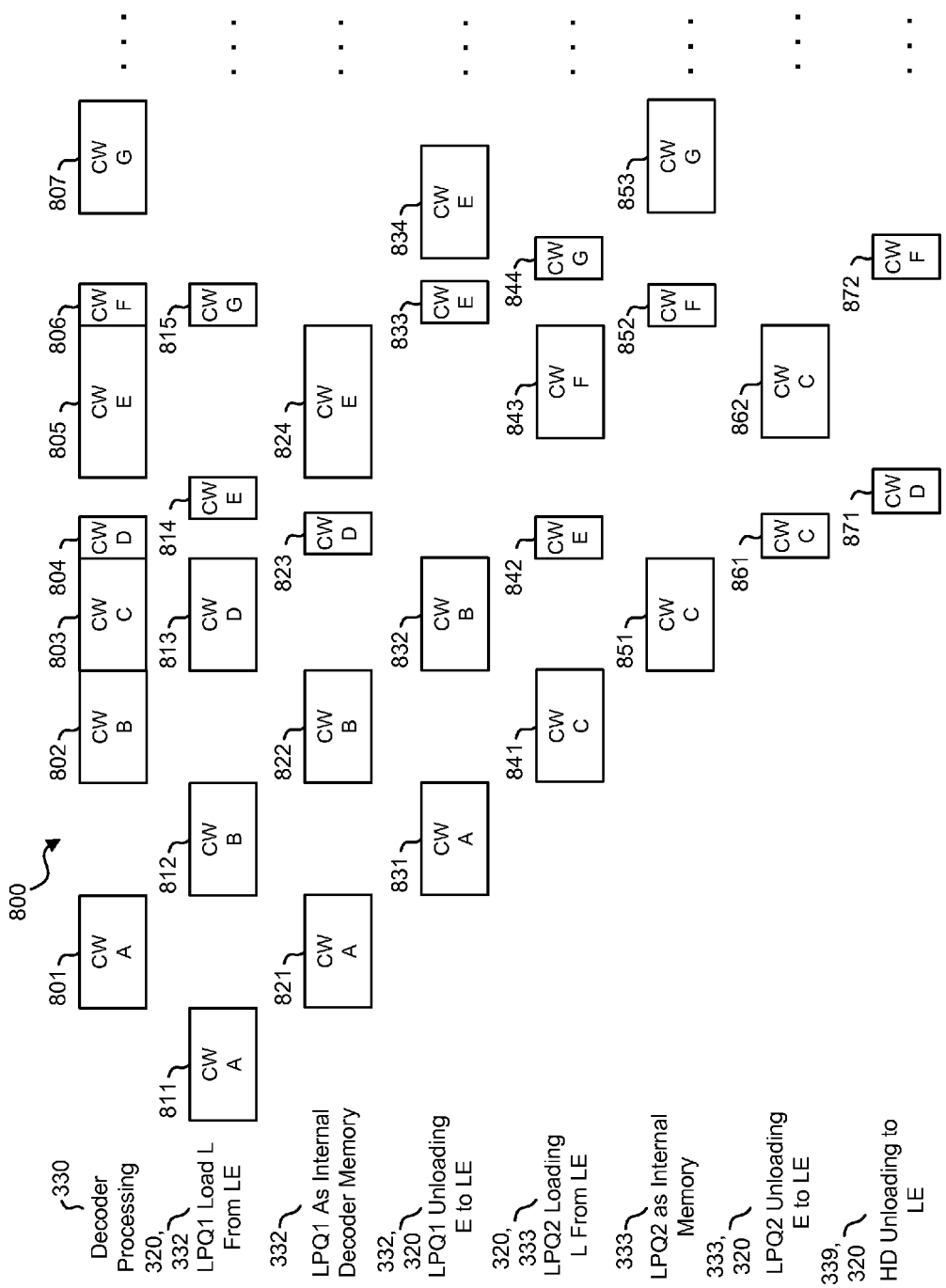
FIG. 8 is another timing diagram showing scheduling of the decoder during processing where one or more codewords converge early causing a speed up process for loading a later processed codeword.

Turning to FIG. 8, another timing diagram 800 shows scheduling of decoder processing circuit 338 during processing where one or more codewords converge early causing a speed up process for loading a later processed codeword. Following timing diagram 800, a codeword A is loaded from centralized queue circuit 320 to ping-pong memory 332 (represented as block 811). LDPC decoder circuit 330 performs a number of local decoder iterations on codeword A (represented as block 801) using ping-pong memory 332 as an internal decoder memory (represented as block 821). Once the number of local decoder iterations are completed, decoder processing circuit 338 transfers codeword A back to centralized queue circuit 320 via subtraction circuit 335 that calculates extrinsic values (represented as block 831).

Concurrent with writing codeword A back to centralized queue circuit 320, a codeword B is loaded from centralized queue circuit 320 to ping-pong memory 332 (represented as block 812). Such a simultaneous transfer in and out of centralized queue circuit 320 is accomplished using a write after read access where a location of a portion of codeword A is unloaded immediately followed by locating a portion of codeword B to the same location. This process continues until all of codeword A is relocated to centralized queue circuit 320 and all of codeword B is relocated to ping-pong memory 332. Write after read permits the sharing of same memory space allocated for a codeword by another codeword. In essence, memory allocated for the incoming codeword at the memory row level as the out going codeword is vacating the space occupied a memory row. Subsequently, LDPC decoder circuit 330 performs a number of local decoder iterations on codeword B (represented as block 802) using ping-pong memory 332 as an internal decoder memory (represented as block 822). Concurrently, a codeword C is loaded from centralized queue circuit 320 to ping-pong memory 333 (represented as block 841).

Once the number of local decoder iterations are completed on codeword B, decoder processing circuit 338 transfers codeword B back to centralized queue circuit 320 via subtraction circuit 335 that calculates extrinsic values (represented as block 832). Concurrently, a codeword D is loaded from centralized queue circuit 320 to ping-pong memory 332 (represented as block 813). Such a simultaneous transfer in and out of centralized queue circuit 320 is accomplished using a write after read access similar to that described above. The write after read process continues until all of codeword B is relocated to centralized queue circuit 320 and all of codeword D is relocated to ping-pong memory 332. Also concurrent with the transfer of codeword B to centralized queue circuit 320, LDPC decoder circuit 330 performs a number of local decoder iterations on codeword C (represented as block 803) using ping-pong memory 333 as an internal decoder memory (represented as block 851).

Subsequently, LDPC decoder circuit 330 performs a number of local decoder iterations on codeword D that result in convergence of codeword D (represented as block 804) using ping-pong memory 332 as an internal decoder memory (represented as block 823). To efficiently use decoder processing circuit 338, another codeword for decoding needs to be quickly loaded into decoder memory 334. To facilitate this, an ongoing low rate transfer of a codeword E from centralized queue circuit 320 to ping-pong memory 333 is aborted (represented as block 842), and a high speed transfer of codeword E from centralized queue circuit 320 to ping-pong memory 332 is performed (represented as block 814). To allow for such a high speed transfer, the ongoing transfer of codeword C from ping-pong memory 333 to centralized queue circuit 320 is paused (represented as blocks 861, 862). Such an increased speed memory transfer is caused by centralized queue scheduling circuit 325 that allocates bandwidth otherwise assigned to transfers between centralized queue circuit 320 and one or more of detection processing circuit 308, detection processing circuit 318, and detection processing circuit 328 to transfers between centralized queue circuit 320 and ping-pong memory 332. At the same time where codeword D is a component of another codeword, hard decision data corresponding to codeword D is transferred from decoder memory circuit 339 to centralized queue circuit 320 for use in later detection processes where all component codewords associated with a given codeword have not yet completed processing similar to that described below in relation to FIG. 10 (represented as block 871).

Once the increased speed memory transfer of codeword E from centralized queue circuit 320 is completed (represented as block 814), LDPC decoder circuit 330 performs a number of local decoder iterations on codeword E (represented as block 805) using ping-pong memory 332 as an internal decoder memory (represented as block 824). Local decoder iterations that were not utilized in processing codeword D due to the early convergence of codeword D (represented as block 804) are used in decoding codeword E (represented as block 805). This addition of unused local decoder iterations is represented by the longer block 805 compared with, for example, the block 803.

While the aforementioned decoding process is ongoing, loading a codeword F from centralized queue circuit 320 to ping-pong memory 333 is performed (represented as block 843), and the previously paused transfer of codeword C from ping-pong memory 333 using a write after read process (block 862) is completed. The write after read process continues until all of codeword C is relocated to centralized queue circuit 320 and all of codeword F is relocated to ping-pong memory 333.

Subsequently, LDPC decoder circuit 330 performs a number of local decoder iterations on codeword F (represented as block 806) using ping-pong memory 333 as an internal decoder memory (represented as block 852) resulting in the convergence of codeword F. Because of the early convergence of codeword F (represented as block 806), the started transfer of a codeword G from centralized queue circuit 320 to ping-pong memory 332 is aborted (represented as block 815). The aborted transfer is replaced with an increased speed memory transfer of codeword G from centralized queue circuit 320 to ping-pong memory 333 (represented as block 844). Such an increased speed memory transfer is caused by centralized queue scheduling circuit 325 that allocates bandwidth otherwise assigned to transfers between centralized queue circuit 320 and one or more of detection processing circuit 308, detection processing circuit 318, and detection processing circuit 328 to transfers between centralized queue circuit 320 and ping-pong memory 333. In addition, a transfer of codeword E to centralized queue circuit 320 from ping-pong memory 332 via subtraction circuit 335 (represented as blocks 833, 834) is paused allowing the memory bandwidth to be applied to the transfer of codeword G from centralized queue circuit 320 to ping-pong memory 333 (represented as block 844). At the same time where codeword F is a component of another codeword, hard decision data corresponding to codeword F is transferred from decoder memory circuit 339 to centralized queue circuit 320 for use in later detection processes where all component codewords associated with a given codeword have not yet completed processing similar to that described below in relation to FIG. 10 (represented as block 872).

Once the increased speed memory transfer of codeword G from centralized queue circuit 320 is completed (represented as block 844), LDPC decoder circuit 330 performs a number of local decoder iterations on codeword G (represented as block 807) using ping-pong memory 333 as an internal decoder memory (represented as block 853). The previously paused loading of codeword E to centralized queue circuit 320 from ping-pong memory 332 via subtraction circuit 335 is completed (represented as block 834). The process of decoding continues with new codewords being introduced as older codewords either converge or time out.

Figure 9:
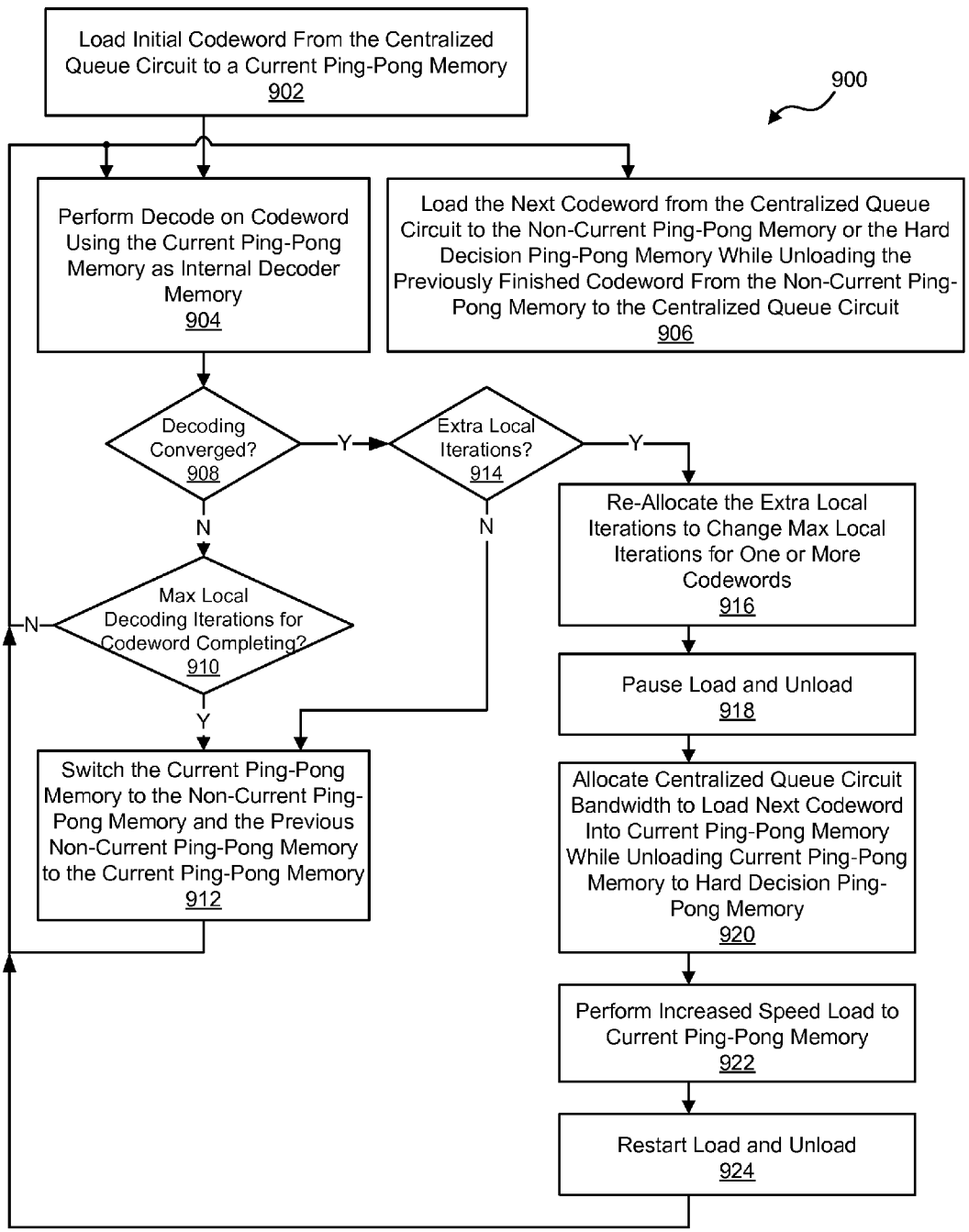
FIG. 9 is a flow diagram showing a method in accordance with one or more embodiments of the present invention for distributing local decoder iterations between processing codewords.

Turning to FIG. 9, a flow diagram 900 shows a method in accordance with one or more embodiments of the present invention for distributing local decoder iterations between processing codewords. Following flow diagram 900, a codeword previously processed by one of detection processing circuit 308, detection processing circuit 318 or detection processing circuit 328 and stored to centralized queue circuit 320 is retrieved from centralized queue circuit 320 and stored to a current ping-pong memory (i.e., one of ping-pong memories 332, 333, with the other of ping-pong memories 332, 333 being the non-current ping-pong memory) (block 902). A decoding algorithm is then applied to the codeword stored in the current ping-pong memory by LDPC decoder circuit 330 (block 904). In this processing, the current ping-pong memory is used as an internal processing memory for LDPC decoder circuit 330. In parallel, a write after read access is used to concurrently unload and load the other (i.e., non-current) ping-pong memory (block 906). In particular, the codeword that recently completed processing through LDPC decoder circuit 330 is written back to centralized queue circuit 320 where the decoding process failed to converge or to one of hard decision memories 336, 337 where the decoding process converged. Concurrently, the next codeword scheduled by centralized queue scheduling circuit 325 to be processed by LDPC decoder circuit 330 is retrieved from centralized queue circuit 320 and written to the other (i.e., non-current) ping-pong memory.

It is determined whether the currently processing codeword (i.e., the codeword in the current ping-pong memory) has converged (block 908). Where the codeword has converged (i.e., the number of violated checks have reduced to a defined level) (block 908), it is determined whether the codeword converged in fewer number of local decoder iterations than were allocated to the codeword, thus leaving extra local iterations to be re-allocated to the processing of other codewords (block 914). Where no extra iterations remain after the convergence (i.e., the codeword converged after the maximum number of local iterations allocated to the codeword) (block 914), the current ping-pong memory is switched to the non-current ping-pong memory, and the previous non-current ping-pong memory is switched to the current ping-pong memory (block 912). The non-current ping-pong memory is then unloaded and re-loaded (block 906) in preparation for the next codeword processing by LDPC decoder circuit 330. In parallel, the decoding algorithm is applied to the codeword that was previously loaded (block 906) into what is now the current ping-pong buffer (block 904). The processes of blocks 908-924 are repeated for this next codeword now in the current ping-pong memory.

Alternatively, where extra iterations remain (block 914), the extra iterations are re-allocated to another codeword currently processing through decoder processing circuit 338 (block 916). The maximum number of local decoder iterations that can be applied to a given codeword includes a default number of iterations that would be applied to any codeword augmented by the extra local iterations available due to early convergence of another codeword. The maximum number of local iterations is allocated and monitored by centralized queue scheduling circuit 325. As one example, where eight local decoder iterations are applied to each codeword and a codeword finishes in five local decoder iterations, the extra three local decoder iterations may be re-allocated to another codeword currently processing in decoder processing circuit 338 (i.e., in one of decoder memory circuit 334 or decoder memory circuit 339), thus allowing a total of eleven local decoder iterations for the codeword receiving the extra iterations. In some cases, the extra iterations are re-allocated to the codeword exhibiting the highest number of violated checks. Based upon the disclosure provided herein, one of ordinary skill in the art will appreciate a variety of different number of default local decoder iterations that may be allocated to a particular codeword and/or a variety of re-allocation mechanisms that may be applied where codewords converge early.

In addition, the ongoing load/unload process being applied to the non-current ping-pong memory to prepare for the next codeword to be decoded (block 906) is paused (block 918). Pausing the ongoing transfer between centralized queue circuit 320 and the non-current ping-pong memory allows for re-allocation of an increased bandwidth of centralized queue circuit 320 for re-loading the current ping-pong memory with another codeword (block 920). As one example, in one particular embodiment of the present invention, centralized queue circuit 320 is capable of supporting a total bandwidth of ninety-six (96) samples per clock that in a standard mode are allocated by dedicating: fifty-two (52) samples per clock for transfers between centralized queue circuit 320 and one or more of detection processing circuit 308, detection processing circuit 318, and detection processing circuit 328; twelve (12) samples per clock to transfers from centralized queue circuit 320 to decoder memory circuit 334; twenty-four (24) samples per clock for calculation of extrinsic values between subtraction circuit 335 and centralized queue buffer 320; and eight (8) samples per clock of idle bandwidth. Where the increased speed memory transfer is a six times speed up, it takes approximately one local iteration of decoder processing circuit 338 to re-load the current ping-pong memory. To allow this, a substantial amount of the preceding bandwidth may be re-allocated to transfers between centralized queue circuit 320 and decoder memory circuit 334. For example, the following bandwidth allocation may be selected to effectuate the increased transfer speed: twelve (12) samples per clock for transfers between centralized queue circuit 320 and detection processing circuit 308 with detection processing circuit 318 and detection processing circuit 328 temporarily paused by suspending an operating clock; and sixty-four (64) samples per clock for transfer of the next codeword being loaded from centralized queue circuit 320 to the current ping-pong memory. Based upon the disclosure provided herein, one of ordinary skill in the art will recognize other allocations of access bandwidth into centralized queue circuit 320 that may be used to cause an increased load speed.

The aforementioned allocation of additional bandwidth to re-loading the current ping-ping memory facilitates for a fast re-loading of the current ping-pong memory and a quick resumption of LDPC decoder circuit 330 (block 922). Once the increased speed load has completed (block 922), the current ping-pong memory is prepared for use as an internal memory for the decoding process and load/unload of the non-current ping-pong memory is restarted under the standard allocation of access bandwidth into centralized queue circuit 320 (block 924). In this condition, the decoder process begins again processing the codeword in the current ping-pong memory (block 904), and the processes of blocks 908-924 are repeated for this next codeword currently stored in the current ping-pong memory.

Alternatively, where the codeword has not previously converged (block 908), it is determined whether the maximum number of local decoder iterations have been applied to the codeword (block 910). Again, the maximum number of local decoder iterations includes a default number of iterations that would be applied to any codeword augmented by any extra local iterations that may have been re-allocated to the codeword by centralized queue scheduling circuit 325 due to early convergence of another codeword.

Where the maximum number of local decoder iterations have not yet been applied to the codeword in the current ping-pong memory (block 910), another decode of the codeword in the current ping-pong memory is performed (block 904). Alternatively, where the maximum number of local decoder iterations have completed (block 910), the current ping-pong memory is switched to the non-current ping-pong memory and the previous non-current ping-pong memory is switched to the current ping-pong memory (block 912). The non-current ping-pong memory is then unloaded and re-loaded (block 906) in preparation for the next codeword processing by LDPC decoder circuit 330. In parallel, the decoding algorithm is applied to the codeword that was previously loaded (block 906) into what is now the current ping-pong buffer (block 904). The processes of blocks 908-924 are repeated for this next codeword.

Figure 10:
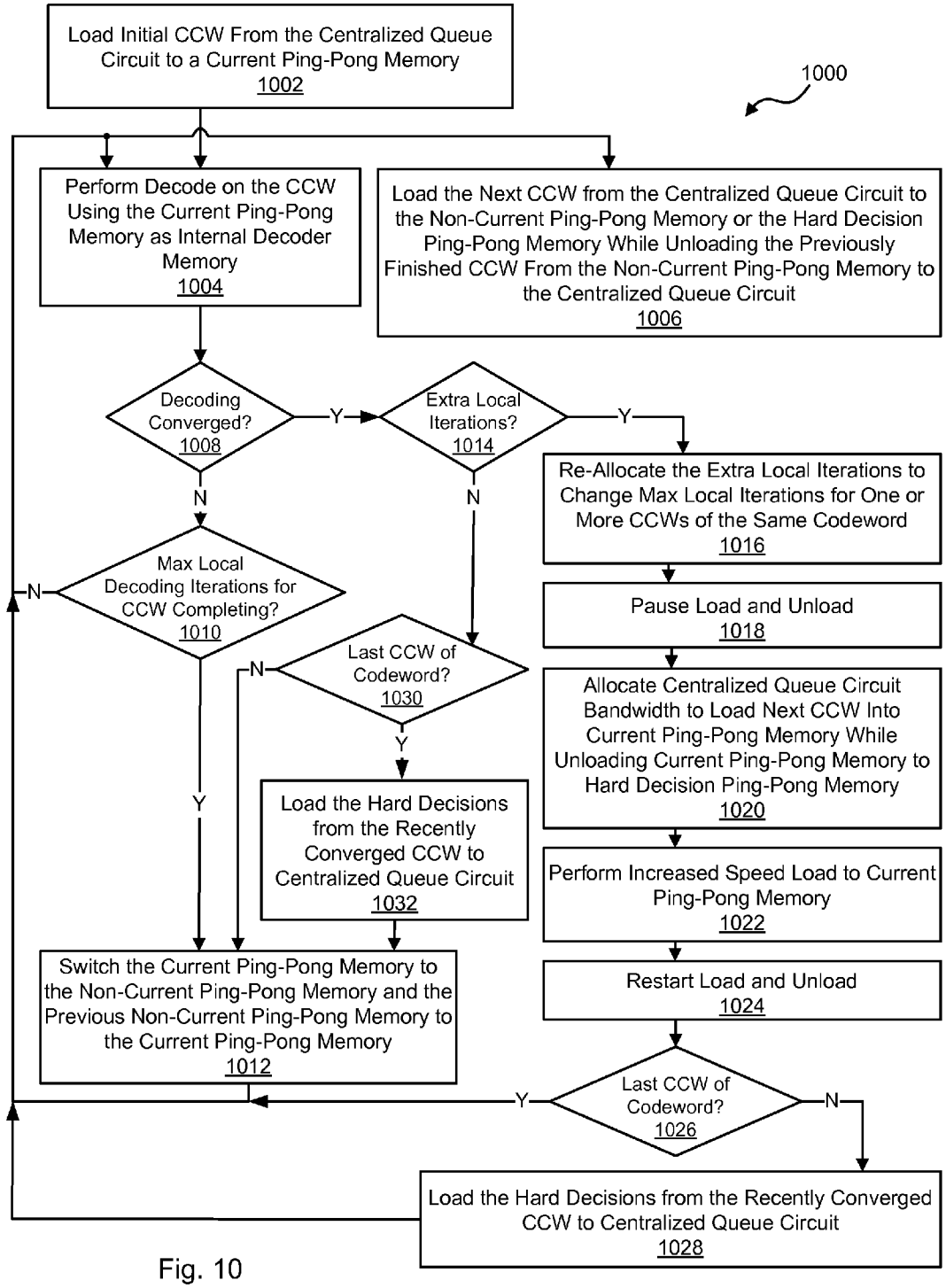
FIG. 10 is a flow diagram showing another method in accordance with one or more embodiments of the present invention for distributing local decoder iterations between processing component codewords.

Turning to FIG. 10, a flow diagram 1000 showing another method in accordance with one or more embodiments of the present invention for distributing local decoder iterations between processing component codewords. Following flow diagram 1000, a component codeword previously processed by one of detection processing circuit 308, detection processing circuit 318 or detection processing circuit 328 and stored to centralized queue circuit 320 is retrieved from centralized queue circuit 320 and stored to a current ping-pong memory (i.e., one of ping-pong memories 332, 333, with the other of ping-pong memories 332, 333 being the non-current ping-pong memory) (block 1002). A decoding algorithm is then applied to the component codeword stored in the current ping-pong memory by LDPC decoder circuit 330 (block 1004). In this processing, the current ping-pong memory is used as an internal processing memory for LDPC decoder circuit 330. In parallel, a write after read access is used to concurrently unload and load the other (i.e., non-current) ping-pong memory (block 1006). In particular, the component codeword that recently completed processing through LDPC decoder circuit 330 is written back to centralized queue circuit 320 where the decoding process failed to converge or to one of hard decision memories 336, 337 where the decoding process converged. Concurrently, the next component codeword scheduled by centralized queue scheduling circuit 325 to be processed by LDPC decoder circuit 330 is retrieved from centralized queue circuit 320 and written to the other (i.e., non-current) ping-pong memory.

It is determined whether the currently processing component codeword (i.e., the component codeword in the current ping-pong memory) has converged (block 1008). Where the component codeword has converged (i.e., the number of violated checks have reduced to a defined level) (block 1008), it is determined whether the component codeword converged in fewer number of local decoder iterations than were allocated to the component codeword, thus leaving extra local iterations to be re-allocated to the processing of other component codewords (block 1014). Where no extra iterations remain after the convergence (i.e., the component codeword converged after the maximum number of local iterations allocated to the component codeword) (block 1014), it is then determined whether the component codeword that recently converged (block 1008) was the last component codeword of the corresponding codeword to converge (block 1030). Where it is not the last component codeword of the corresponding codeword to converged (block 1032), the hard decisions are copied from the decoder memory circuit 339 back to centralized queue circuit 320 for use in relation to future detection processes performed by detection processing circuit 318 or detection processing circuit 328 on the codeword of which the converged component codeword is part (block 1032). In either case (block 1030), the current ping-pong memory is switched to the non-current ping-pong memory, and the previous non-current ping-pong memory is switched to the current ping-pong memory (block 1012). The non-current ping-pong memory is then unloaded and re-loaded (block 1006) in preparation for the next component codeword processing by LDPC decoder circuit 330. In parallel, the decoding algorithm is applied to the component codeword that was previously loaded (block 1006) into what is now the current ping-pong buffer (block 904). The processes of blocks 1008-1032 are repeated for this next component codeword now in the current ping-pong memory.

Alternatively, where extra iterations remain (block 1014), the extra iterations are re-allocated to another component codeword currently processing through decoder processing circuit 338 (block 1016). The maximum number of local decoder iterations that can be applied to a given component codeword includes a default number of iterations that would be applied to any component codeword plus the extra local iterations available due to early convergence of another component codeword. The maximum number of local iterations is allocated and monitored by centralized queue scheduling circuit 325. As one example, where five local decoder iterations are applied to each component codeword and a component codeword finishes in three local decoder iterations, the extra two local decoder iterations may be re-allocated to another component codeword currently processing in decoder processing circuit 338 (i.e., in one of decoder memory circuit 334 or decoder memory circuit 339), thus allowing a total of seven local decoder iterations for the component codeword receiving the extra iterations. In some cases, the extra iterations are re-allocated to the component codeword exhibiting the lowest number of violated checks. Based upon the disclosure provided herein, one of ordinary skill in the art will appreciate a variety of different number of default local decoder iterations that may be allocated to a particular component codeword and/or a variety of re-allocation mechanisms that may be applied where component codewords converge early.

In addition, the ongoing load/unload process being applied to the non-current ping-pong memory to prepare for the next component codeword to be decoded (block 1006) is paused (block 1018). Pausing the ongoing transfer between centralized queue circuit 320 and the non-current ping-pong memory allows for re-allocation of an increased bandwidth of centralized queue circuit 320 for re-loading the current ping-pong memory with another component codeword (block 1020). As one example, in one particular embodiment of the present invention, centralized queue circuit 320 is capable of supporting a total bandwidth of ninety-six (96) samples per clock that in a standard mode are allocated by dedicating: fifty-two (52) samples per clock for transfers between centralized queue circuit 320 and one or more of detection processing circuit 308, detection processing circuit 318, and detection processing circuit 328; twelve (12) samples per clock to transfers from centralized queue circuit 320 to decoder memory circuit 334; twenty-four (24) samples per clock for calculation of extrinsic values between subtraction circuit 335 and centralized queue buffer 320; and eight (8) samples per clock of idle bandwidth. Where the increased speed memory transfer is a six times speed up, it takes approximately one local iteration of decoder processing circuit 338 to re-load the current ping-pong memory. To allow this, a substantial amount of the preceding bandwidth may be re-allocated to transfers between centralized queue circuit 320 and decoder memory circuit 334. For example, the following bandwidth allocation may be selected to effectuate the increased transfer speed: twelve (12) samples per clock for transfers between centralized queue circuit 320 and detection processing circuit 308 with detection processing circuit 318 and detection processing circuit 328 temporarily paused by suspending an operating clock; and sixty-four (64) samples per clock for transfer of the next codeword being loaded from centralized queue circuit 320 to the current ping-pong memory. Based upon the disclosure provided herein, one of ordinary skill in the art will recognize other allocations of access bandwidth into centralized queue circuit 320 that may be used to cause an increased load speed.

The aforementioned allocation of additional bandwidth to re-loading the current ping-ping memory facilitates for a fast re-loading of the current ping-pong memory and a quick resumption of LDPC decoder circuit 330 (block 1022). Once the increased speed load has completed (block 1022), the current ping-pong memory is prepared for use as an internal memory for the decoding process and load/unload of the non-current ping-pong memory is restarted under the standard allocation of access bandwidth into centralized queue circuit 320 (block 1024).

It is then determined whether the component codeword that recently converged (block 1008) was the last component codeword of the corresponding codeword to converge (block 1026). Where it is not the last component codeword of the corresponding codeword to converged (block 1026), the hard decisions are copied from the decoder memory circuit 339 back to centralized queue circuit 320 for use in relation to future detection processes performed by detection processing circuit 318 or detection processing circuit 328 on the codeword of which the converged component codeword is part (block 1028). In either case (block 1026), the decoder process begins again processing the codeword in the current ping-pong memory (block 1004), and the processes of blocks 1008-1032 are repeated for this next component codeword currently stored in the current ping-pong memory.

Alternatively, where the component codeword has not previously converged (block 1008), it is determined whether the maximum number of local decoder iterations have been applied to the component codeword (block 1010). Again, the maximum number of local decoder iterations includes a default number of iterations that would be applied to any component codeword augmented by any extra local iterations that may have been re-allocated to the component codeword by centralized queue scheduling circuit 325 due to early convergence of another component codeword.

Where the maximum number of local decoder iterations have not yet been applied to the component codeword in the current ping-pong memory (block 1010), another decode of the component codeword in the current ping-pong memory is performed (block 1004). Alternatively, where the maximum number of local decoder iterations have completed (block 1010), the current ping-pong memory is switched to the non-current ping-pong memory and the previous non-current ping-pong memory is switched to the current ping-pong memory (block 1012). The non-current ping-pong memory is then unloaded and re-loaded (block 1006) in preparation for the next component codeword processing by LDPC decoder circuit 330. In parallel, the decoding algorithm is applied to the component codeword that was previously loaded (block 1006) into what is now the current ping-pong buffer (block 904). The processes of blocks 1008-1032 are repeated for this next component codeword.

In conclusion, the invention provides novel systems, devices, methods and arrangements for performing iterative data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A method for data processing, the method comprising:
   providing a decoder processing circuit having a first memory, a second memory, and a decoder circuit;
   providing a centralized queue communicably coupled to the decoder processing circuit;
   loading a first data set from the centralized queue to the first memory; and
   concurrent with the loading the first data set, applying a data decoding algorithm to a second data set by the decoder circuit.

2. The method of claim 1, wherein the method further comprises:
   determining that applying the decoding algorithm to the second data set resulted in convergence of the second data set;
   determining that the second data set converged in an allocated number of local decoder iterations;
   loading a third data set into the second memory from the centralized queue; and
   concurrent with the loading the third data set, applying the data decoding algorithm to the first data set by the decoder circuit.

3. The method of claim 1, wherein the method further comprises:
   determining that an allocated number of decoder iterations have been applied to the second data set;
   unloading the second data set from the second memory to the centralized queue;
   loading a third data set into the second memory from the centralized queue; and
   concurrent with the loading the third data set, applying the data decoding algorithm to the first data set by the decoder circuit.

4. The method of claim 3, wherein unloading the second data set and loading the third data set is performed using a write after read operation.

5. The method of claim 1, wherein the method further comprises:
   determining that applying the decoding algorithm to the second data set resulted in convergence of the second data set;
   determining that the second data set converged in less than an allocated number of local decoder iterations;
   re-allocating a residual number of local decoder iterations to a third data set;
   loading the third data set into the second memory from the centralized queue; and
   concurrent with the loading the third data set, pausing loading the first data set from the centralized queue to the first memory.

6. The method of claim 5, wherein loading the third data set into the second memory from the centralized queue is done using an increased speed memory transfer.

7. The method of claim 6, wherein the increased speed memory transfer is facilitated by allocating transfer bandwidth between the first memory and the centralized queue to transfers between the second memory and the centralized queue used for loading the third data set.

8. The method of claim 7, wherein the method further includes:
   transferring a fourth data set between the centralized queue and a detection processing circuit; and
   concurrent with the loading the third data set, pausing transferring the fourth data set from the centralized queue to the detection processing circuit.

9. The method of claim 5, wherein the method further comprises:
   writing hard decision data corresponding to the second data set to a hard decision memory.

10. The method of claim 9, wherein the second data set is a codeword.

11. The method of claim 9, wherein the second data set is a first component codeword corresponding to a codeword, and wherein the method further includes:
   determining whether a second component codeword corresponding to the codeword failed to converge; and
   writing the hard decision data corresponding to the second data set to the centralized queue.

12. The method of claim 11, wherein the method further comprises:
   approximating the second data set based on the hard decision data corresponding to the second data set to assemble the codeword prior to a subsequent data detection process.

13. A data processing system, the data processing system comprising:
   a decoder processing circuit having a first memory, a second memory, and a decoder circuit;
   a queue circuit communicably coupled to the decoder processing circuit; and
   a queue scheduling circuit operable to schedule loading of a first data set from the queue circuit to the first memory; and
   wherein the decoder circuit is operable to apply a data decoding algorithm to a second data set concurrent with the loading the first data set.

14. The data processing system of claim 13, wherein the queue scheduling circuit is operable to schedule a number of decoder iterations to be applied to the second data set; wherein the queue scheduling circuit is operable to schedule unloading the second data set from the second memory to the centralized queue and loading a third data set into the second memory from the centralized queue; and wherein concurrent with the loading the third data set, the decoder circuit is operable to apply the data decoding algorithm to the first data set by the decoder circuit.

15. The data processing system of claim 13, wherein the queue scheduling circuit is operable to schedule a number of decoder iterations to be applied to the second data set; wherein the decoder circuit is operable to determine that applying the decoding algorithm to the second data set resulted in convergence of the second data set and to determine that the second data set converged in less than an allocated number of local decoder iterations; wherein the queue scheduling circuit is operable to re-allocate a residual number of local decoder iterations to a third data set and to schedule loading the third data set into the second memory from the centralized queue; and concurrent with the loading the third data set, pausing loading the first data set from the centralized queue to the first memory.

16. The data processing system of claim 15, wherein loading the third data set into the second memory from the centralized queue is done using an increased speed memory transfer.

17. The data processing system of claim 16, wherein the queue scheduling circuit is operable to allocate transfer bandwidth between the first memory and the centralized queue to transfers between the second memory and the centralized queue used for loading the third data set to facilitate the increased speed memory transfer.

18. The data processing system of claim 17, wherein the queue scheduling circuit is operable to schedule transferring a fourth data set between the centralized queue and a detection processing circuit, and pausing transferring the fourth data set from the centralized queue to the detection processing circuit concurrent with the loading the third data set.

19. The data processing system of claim 18, wherein the second data set is a first component codeword corresponding to a codeword, and wherein the queue scheduling circuit is further operable to: determine whether a second component codeword corresponding to the codeword failed to converge; and schedule writing the hard decision data corresponding to the second data set to the centralized queue.

20. A hard disk drive system, the hard disk drive system comprising:
   a data storage medium maintaining a first data set and a second data set;
   a channel communicably coupled to the storage medium, wherein the channel includes:
   a decoder processing circuit having a first memory, a second memory, and a decoder circuit;
   a queue circuit communicably coupled to the decoder processing circuit;
   a queue scheduling circuit operable to schedule loading of the first data set from the queue circuit to the first memory; and
   wherein the decoder circuit is operable to apply a data decoding algorithm to the second data set concurrent with the loading the first data set.

21. The data processing system of claim 13, wherein the data processing system is implemented as part of a device selected from a group consisting of: a data transmission device, and a data storage device.

22. The data processing system of claim 13, wherein the data processing system is implemented as part of an integrated circuit.

23. A data processing system, the data processing system comprising:
   a decoder processing circuit having a first memory, a second memory, and a decoder circuit, wherein the decoder circuit is operable to apply a data decoding algorithm to a decoder input;
   a detector processing circuit operable to apply a data detection algorithm to an input data set to yield a detected output, wherein the decoder input is derived from the detected output;
   a scheduling circuit operable to schedule loading of a data set corresponding to the detected output to the first memory; and
   wherein the decoder circuit is operable to apply the data decoding algorithm to a second data set concurrent with the loading the first data set.

24. The data processing system of claim 23, wherein the data decoding algorithm is a low density parity check decoder circuit.

25. The data processing system of claim 23, wherein the scheduling circuit is operable to schedule a number of decoder iterations to be applied to the second data set; wherein the scheduling circuit is operable to schedule unloading the second data set from the second memory to a data transfer memory and loading a third data set into the second memory from the data transfer memory; and wherein concurrent with the loading the third data set, the decoder circuit is operable to apply the data decoding algorithm to the first data set by the decoder circuit.

26. The data processing system of claim 25, wherein the data transfer memory is communicably coupled to the decoder processing circuit and the detector processing circuit.

27. The data processing system of claim 23, wherein the scheduling circuit is operable to schedule a number of decoder iterations to be applied to the second data set; wherein the decoder circuit is operable to determine that applying the decoding algorithm to the second data set resulted in convergence of the second data set and to determine that the second data set converged in less than an allocated number of local decoder iterations; wherein the scheduling circuit is further operable to re-allocate a residual number of local decoder iterations to a third data set and to schedule loading the third data set into the second memory from a data transfer memory; and concurrent with the loading the third data set, pausing loading the first data set from the data transfer memory to the first memory.

28. The data processing system of claim 27, wherein loading the third data set into the second memory from the data transfer memory is done using an increased speed memory transfer.

29. The data processing system of claim 28, wherein the scheduling circuit is operable to allocate transfer bandwidth between the first memory and the data transfer memory to transfers between the second memory and the data transfer memory used for loading the third data set to facilitate the increased speed memory transfer.

30. The data processing system of claim 29, wherein the scheduling circuit is operable to schedule transferring a fourth data set between the data transfer memory and the detection processing circuit, and pausing transferring the fourth data set from the data transfer memory to the detection processing circuit concurrent with the loading the third data set.

31. The data processing system of claim 30, wherein the second data set is a first component codeword corresponding to a codeword, and wherein the scheduling circuit is further operable to: determine whether a second component codeword corresponding to the codeword failed to converge; and schedule writing the hard decision data corresponding to the second data set to the centralized queue.

32. The data processing system of claim 23, wherein the data processing system is implemented as part of a device selected from a group consisting of: a data transmission device, and a data storage device.

33. The data processing system of claim 23, wherein the data processing system is implemented as part of an integrated circuit.

* * * * *